(12) United States Patent
Kholodenko et al.

(10) Patent No.: US 8,900,400 B2
(45) Date of Patent: *Dec. 2, 2014

(54) PROXIMITY HEAD HAVING A FLUID RESISTOR

(71) Applicant: Lam Research Corporation, Fremont, CA (US)

(72) Inventors: Arnold Kholodenko, San Francisco, CA (US); Cheng-Yu (Sean) Lin, Mountain View, CA (US); Russell Martin, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/661,969

(22) Filed: Oct. 26, 2012

(65) Prior Publication Data

US 2013/0048765 A1 Feb. 28, 2013

Related U.S. Application Data

(63) Continuation of application No. 12/367,515, filed on Feb. 7, 2009, now Pat. No. 8,317,966.

(60) Provisional application No. 61/065,088, filed on Feb. 8, 2008.

(51) Int. Cl.
*H01L 21/67* (2006.01)
*B08B 3/00* (2006.01)

(52) U.S. Cl.
CPC ....... *H01L 21/67051* (2013.01); *Y10S 134/902* (2013.01)
USPC ..................... 156/345.11; 134/99.1; 134/902

(58) Field of Classification Search
USPC ....... 134/95.1, 98.1, 99.1, 115 R, 166 R, 171, 134/182, 183, 902; 156/292, 308.2, 315.11, 156/345.22, 345.11
See application file for complete search history.

(56) References Cited

U.S. PATENT DOCUMENTS

| | | | |
|---|---|---|---|
| 6,954,993 B1 * | 10/2005 | Smith et al. ..................... 34/407 |
| 7,003,899 B1 * | 2/2006 | Garcia et al. .................... 34/566 |
| 7,093,375 B2 | 8/2006 | O'Donnell |
| 7,143,527 B2 * | 12/2006 | Garcia et al. ..................... 34/380 |
| 7,198,055 B2 * | 4/2007 | Woods et al. ................ 134/95.2 |
| 7,234,477 B2 * | 6/2007 | de Larios et al. ............ 134/95.2 |
| 7,520,285 B2 * | 4/2009 | Garcia .......................... 134/98.1 |
| 2002/0023671 A1 * | 2/2002 | Mitsumori et al. ........... 134/151 |
| 2006/0064895 A1 * | 3/2006 | Garcia et al. .................... 34/566 |
| 2009/0159201 A1 * | 6/2009 | Kholodenko et al. ........ 156/292 |

FOREIGN PATENT DOCUMENTS

| | | | |
|---|---|---|---|
| JP | 2003-297800 A | 10/2003 |
| JP | 2005-347326 A | 12/2005 |
| JP | 2006-049858 A | 2/2006 |

* cited by examiner

*Primary Examiner* — Joseph L Perrin
(74) *Attorney, Agent, or Firm* — Martine Penilla Group, LLP

(57) ABSTRACT

A proximity head defined by a body having a length. The body includes a main bore defined therein and extending along the length. A resistor bore is defined in the body and extends along the length. The resistor bore defined below the main bore. A first plurality of bores defined between the main bore and the resistor bore and a second plurality of bores defined between the resistor bore and an exterior surface of the body. The exterior surface of the body defining a proximity surface of the proximity head.

12 Claims, 18 Drawing Sheets

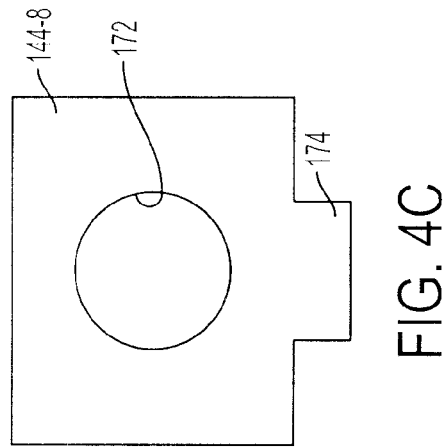
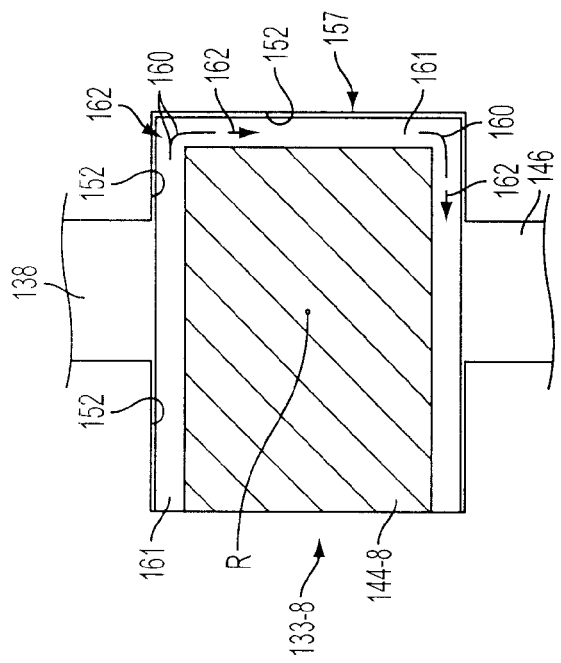
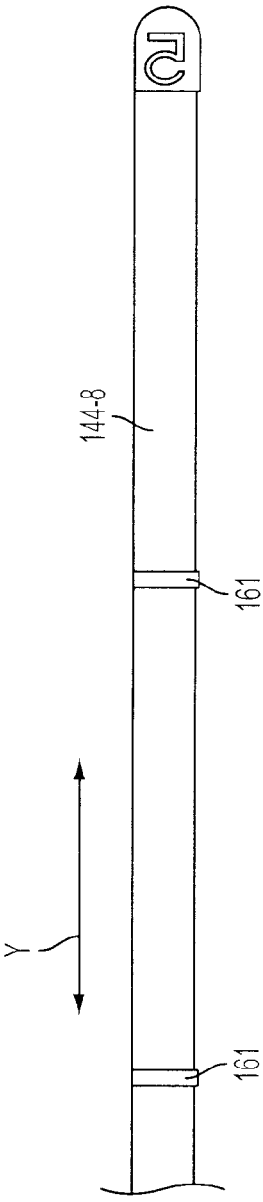
FIG. 4C
FIG. 4B
FIG. 4D

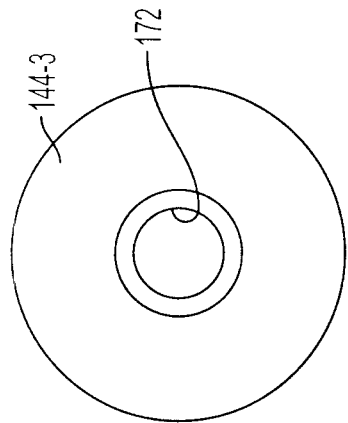
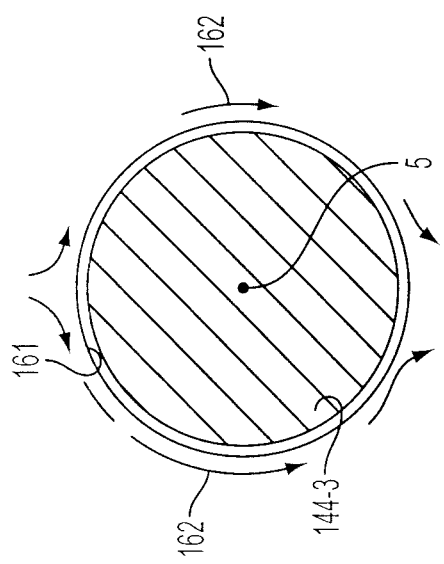
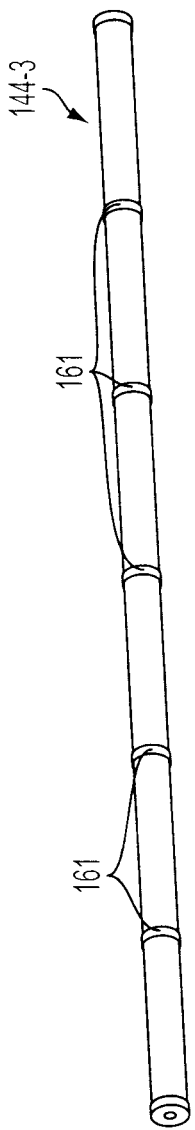
FIG. 5C
FIG. 5D
FIG. 5B

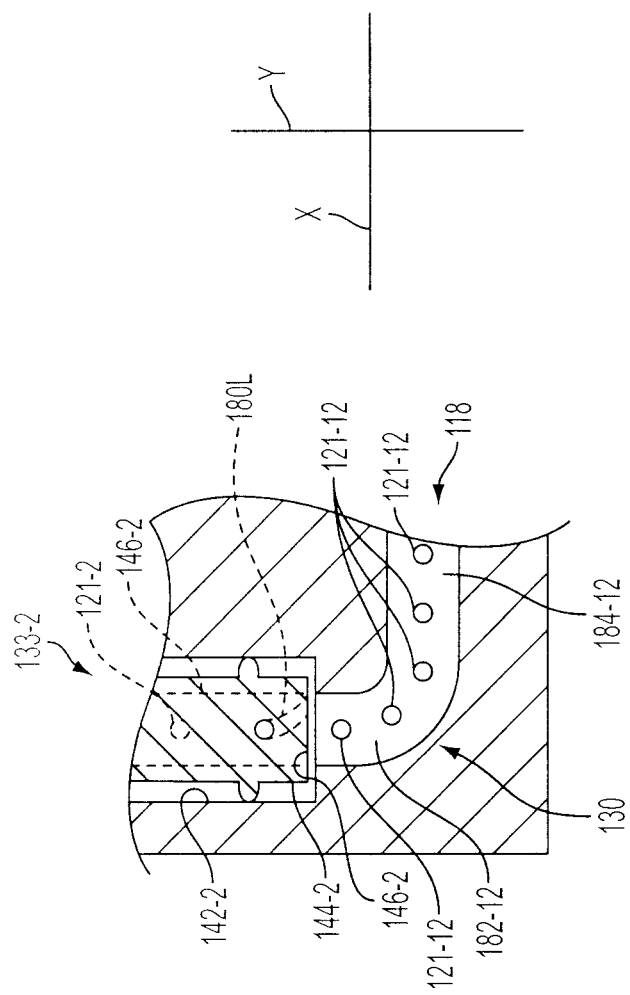

PROXIMITY HEAD HAVING A FLUID RESISTOR

CLAIM OF PRIORITY

This application is a continuation application of the U.S. patent application Ser. No. 12/367,515, filed on Feb. 7, 2009, entitled "Apparatus for Substantially Uniform Fluid Flow Rates Relative to A Proximity Head in Processing of A Wafer Surface by A Meniscus", which claimed priority of U.S. Provisional Application No. 61/065,088, filed on Feb. 8, 2008, and titled "Apparatus for Substantially Uniform Fluid Flow Rates Relative To A Proximity Head in Processing Of A Wafer Surface By A Meniscus." These applications are incorporated herein by reference in their entireties for all purposes.

CROSS REFERENCE TO RELATED APPLICATIONS

This application is related to U.S. application Ser. No. 10/261,839, filed Sep. 30, 2002, issued on Jun. 26, 2007 as U.S. Pat. No. 7,234,477 and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES"; and U.S. application Ser. No. 10/330,843, filed Dec. 24, 2002, issued as U.S. Pat. No. 7,198,055, on Apr. 3, 2007, and entitled "MENISCUS, VACUUM, IPA VAPOR, DRYING MANIFOLD"; and U.S. application Ser. No. 10/330,897, filed Dec. 24, 2002, issued as U.S. Pat. No. 7,240,679, on Jul. 10, 2007, and entitled "SYSTEM FOR SUBSTRATE PROCESSING WITH MENISCUS, VACUUM, IPA VAPOR, DRYING MANIFOLD"; and U.S. patent application Ser. No. 11/552,794, filed on Oct. 25, 2006, and entitled "APPARATUS AND METHOD FOR SUBSTRATE ELECTROLESS PLATING"; and U.S. patent application Ser. No. 12/340,394, filed on Dec. 19, 2008, and entitled "Methods Of Configuring A Proximity Head That Provides Uniform Fluid Flow Relative To A Wafer", which applications are incorporated herein by reference.

BACKGROUND

1. Field of the Invention

The present invention relates generally to wafer wet clean processes and to equipment for processing wafers, and more particularly to apparatus for promoting uniform fluid flow relative to a proximity head in processing of a surface of a wafer by a meniscus.

2. Description of the Related Art

In the semiconductor chip fabrication industry, it is necessary to clean and dry a wafer (e.g., a substrate) after a fabrication operation if, e.g., the operation leaves unwanted residues on surfaces of the substrate. Examples of such a fabrication operation include plasma etching and chemical mechanical polishing (CMP), each of which may leave unwanted residues on surfaces of the substrate. Unfortunately, if left on the substrate, the unwanted residues may cause defects in devices made from the substrate, in some cases rendering the devices inoperable.

Cleaning the substrate after a fabrication operation is intended to remove the unwanted residues. After a substrate has been wet cleaned, the substrate must be dried effectively to prevent water or other processing fluid (hereinafter "fluid") remnants from also leaving unwanted residues on the substrate. If the fluid on the substrate surface is allowed to evaporate, as usually happens when droplets form, residues or contaminants previously dissolved in the fluid will remain on the substrate surface after evaporation and can form spots and cause defects. To prevent evaporation from taking place, the cleaning fluid must be removed as quickly as possible without the formation of droplets on the substrate surface. In an attempt to accomplish this, one of several different drying techniques may be employed such as spin-drying, IPA, or Marangoni drying. All of these drying techniques utilize some form of a moving liquid/gas interface on a substrate surface, which, only if properly maintained, results in drying of a substrate surface without the formation of droplets. Unfortunately, if the moving liquid/gas interface breaks down, as often happens with all of the aforementioned drying methods, droplets form, droplet evaporation occurs, and contaminants remain on the substrate surface.

In view of the foregoing, there is a need for improved cleaning apparatus that provides efficient substrate cleaning while reducing the likelihood of contaminants remaining on the substrate surface from dried fluid droplets.

SUMMARY

Broadly speaking, embodiments of the present invention fill the above need by conditioning fluid flow that is relative to a proximity head in processing of a surface of a wafer by a meniscus. The need is filled by configuring the proximity head in one piece so that fluid may be introduced into the proximity head for delivery to the wafer surface, and fluid may be introduced into the proximity head from the surface of the wafer, and head rigidity is maintained even as the head is lengthened to enable cleaning of wafers with larger diameters. The proximity head may have a head surface with a plurality of flat surfaces. With the plurality of flat surfaces configured for placement in a substantially parallel orientation with respect to the surface of the wafer, fluid flowing in a main flow in the head for delivery to the wafer surface is substantially conditioned to define a substantially uniform fluid outflow from a plurality of outlet ports to the wafer surface. With the plurality of flat surfaces in that orientation, fluid flowing in separate flow paths from a plurality of inlet ports to another main flow in the head is substantially conditioned to define a substantially uniform fluid inflow into the inlet ports from the wafer surface. The need is further filled by the proximity head that is configured to maintain head rigidity by a one-piece configuration that defines the main fluid flows and defines separate flows of fluid relative to the wafer surface. The flows to and from the wafer surface define a meniscus extending to the surface of a wafer. The separate flows are in fluid transfer flow paths, both into the inlet ports and from the outlet ports. Each of these flows is at a flow rate that is substantially uniform relative to flow rates in the other paths.

To provide the conditioned flows from and into the head, the proximity head is configured with many structures according to low tolerances, and with a reduced number of structures that are configured according to high tolerances. A structure according to high tolerances includes a flow resistor unit configured in the head to provide a highest flow resistance path between the main fluid flow and the respective plurality of inlet and outlets ports. One highest flow resistance flow path receives separate flows that are in fluid transfer flow paths into the inlet ports. From another highest flow resistance flow path there are separate flows in fluid transfer flow paths that exit the outlet ports. The fluid conditioning by the respective flow resistor unit renders each of the respective inlet port and outlet port flows of the fluid at a rate that is substantially uniform relative to flow rates in the other respective paths. The structures configured according to the high tolerance are thus effective to render the respective flows of the fluid substantially uniform across the length of the head even though the other structures of the head are configured according to the low tolerances.

It should be appreciated that the present invention can be implemented in numerous ways, including as an apparatus or a system. Several inventive embodiments of the present invention are described below.

In one embodiment, a proximity head defined by a body having a length is disclosed. The body includes a main bore defined therein and extending along the length. A resistor bore is defined in the body and extends along the length. The resistor bore defined below the main bore. A first plurality of bores defined between the main bore and the resistor bore and a second plurality of bores defined between the resistor bore and an exterior surface of the body. The exterior surface of the body defining a proximity surface of the proximity head.

In one embodiment, a proximity head including a main inlet bore configured to receive a fluid to be provided to the proximity head is disclosed. The main inlet bore extending along a length of the proximity head. A plurality of down flow bores having first ends connected to the main inlet bore, and the plurality of down flow bores are spaced apart from each other along the length of the proximity head. An upper plenum connected to second ends of the plurality of down flow bores. Each down flow bore providing a feed of the fluid into the upper plenum and the upper plenum extends along the length of the proximity head. A resistor bore extends along the length of the proximity head and being connected to the upper plenum, the resistor bore being configured to receive a resistor, the resistor having a shape so as to limit flow of the fluid through the resistor bore. A lower plenum extending along the length of the proximity head and being connected to the resistor bore, the lower plenum being configured to receive fluid from the resistor bore as limited by the resistor. Also included is a plurality of outlet ports defined along the length of the proximity head and extending between the lower plenum and the flat surfaces of the head surface.

In one embodiment, apparatus is provided for conditioning fluid flowing relative to a surface of a proximity head in meniscus processing of a wafer surface. The apparatus may be configured from a one-piece block, the block being configured with a length extending across an entire extent of the wafer surface. For a fluid transfer unit, the block may include a main fluid transfer bore configured generally parallel to the head surface across the block length. For the unit, the block may also include a resistor unit extending across the block length and configured between the main bore and the head surface to impose a resistance on the fluid flowing relative to the head surface (e.g., into or out of ports) between the main bore and the head surface. For the fluid transfer unit, the block may also include a first plurality of bores and a second plurality of bores. Such bores may be referred to as a plurality of arrays of fluid transfer units. Each such array extends only in a fluid transfer direction. These plurality of arrays consist of (i.e., only include) a first set of fluid transfer bores and a second set of fluid transfer bores. The first set is represented by the first plurality of bores, and the second set is represented by the second plurality of bores. Bores of the first set are open to and between the main bore and the resistor unit. Bores of the second set are open to and between the resistor unit and the head surface so that the resistor unit of the unit substantially conditions the fluid flowing relative to the head surface and flowing between the main bore and the head surface and all across the wafer surface.

In one other embodiment, an apparatus may include structure for conditioning fluid flow introduced into a proximity head for delivery to a surface of a wafer. The proximity head has a head surface with a plurality of flat surfaces, the plurality of flat surfaces being configured for placement in a substantially parallel orientation with respect to the surface of the wafer. The apparatus may include a main inlet bore configured to initially receive a fluid to be provided to the proximity head. The main inlet bore extends along a length of the proximity head. A plurality of down flow bores having first ends are connected to the main inlet bore. The plurality of down flow bores are spaced apart from each other along the length of the proximity head. An upper plenum may be connected to second ends of the plurality of down flow bores. Each down flow bore provides a feed of the fluid into the upper plenum, the upper plenum extending along the length of the proximity head. A resistor bore may extend along the length of the proximity head and be connected to the upper plenum. The resistor bore may be configured to receive a resistor, the resistor having a shape so as to limit flow of the fluid through the resistor bore. A lower plenum extends along the length of the proximity head and may be connected to the resistor bore, the lower plenum being configured to receive fluid from the resistor bore as limited by the resistor. A plurality of outlet ports is defined along the length of the proximity head and extend between the lower plenum and the flat surfaces of the head surface. Fluid flowing through the upper plenum, the resistor bore with the resistor and the lower plenum is substantially conditioned, and from a highest flow resistance flow path in the resistor bore there are separate flows in fluid transfer flow paths from the outlet ports. The fluid conditioning by the flow resistor bore and resistor renders the outlet port flows of the fluid at a rate that is substantially uniform relative to flow rates in the flows from the other paths of the outlet ports.

In another embodiment, a proximity head is provided for defining a main fluid flow and separate flows of fluid. The separate flows are in flow paths relative to a plurality of flat surfaces to define a meniscus extending to a surface of a wafer. The separate flow in each flow path is at a rate that is substantially uniform relative to flow rates in the other paths. The plurality of flat surfaces may be configured for placement in a substantially parallel orientation with respect to the surface of the wafer. A block may extend in a direction of the length and in a fluid transfer direction perpendicular to the length direction and in a width direction perpendicular to the length and fluid transfer directions, the block defining the plurality of flat surfaces. A main bore may be configured in the block to initially receive a main fluid flow, the main bore extending along the length of the proximity head. A plurality of separate flow bores is configured in the block and having first ends connected to the main bore, the plurality of separate flow bores being spaced apart from each other along the length of the main bore and having second ends. An upper plenum may be configured in the block and connected to the second ends of each of the separate flow bores to transfer the fluid flow relative to the separate flow bores. A resistor may be configured with a bore extending in the block along the length of and intersecting the upper plenum, the resistor being further configured with a flow restrictor received in the resistor bore to define at least one tortuous path for fluid flow relative to the upper plenum. A lower plenum may be configured in the block with an open top extending in the length direction to transfer fluid relative to the tortuous fluid flow path, the lower plenum extending in the fluid transfer direction from the open top to a series of fluid outlets spaced across the length direction. A plurality of outlet ports may be configured in the block, one outlet port being connected to each respective fluid outlet for transferring one of the separate flows of the fluid relative to the head. The fluid flow through the tortuous path renders the flow in each outlet port flow at a rate that is substantially uniform relative to flow rates of the flows in the other outlet ports.

In another embodiment, a proximity head is provided for providing a plurality of fluid transfer units. Each unit provides a main fluid flow, and provides separate flows of fluid relative to a surface of a wafer. The units cooperate to define a meniscus extending from the proximity head to the wafer surface so that the separate flows of the fluid relative to the surface of the wafer are substantially uniform in each respective unit across a length of the proximity head. A block defines the proximity head extending in a length direction across the wafer surface and in a fluid transfer direction and in a head width direction, the block being configured with a first of the fluid transfer units. The first unit includes a main bore configured in the block to transfer a main flow of fluid, the main bore extending along the head length. An upper plurality of flow channels extends in the block in the fluid transfer direction and having first ends in fluid communion with the main bore, the upper channels being spaced across the head length and having second ends. An upper plenum is configured in the block and connected to the second ends of each of the flow channels to transfer fluid. The main bore and the upper plurality of flow channels are configured to separate the main flow directly into a total number of separate flow paths that are between the main bore and the upper plenum. A resistor unit is configured with a resistor bore extending in the block in the length direction to restrict transfer of fluid in the fluid transfer direction relative to the upper plenum. A lower plenum is configured with an open top extending along the head length in fluid communication with the resistor unit, the lower plenum being further configured extending in the fluid transfer direction from the open top to a series of fluid transfer ports spaced evenly across the head length. The resistor unit is further configured with a resistive insert received in the resistor bore for defining a thin flow path around the insert to resist fluid flow relative to the upper plenum and relative to the lower plenum. A plurality of fluid transfer ducts is configured in the block extending in the fluid transfer direction, one duct being connected to each respective fluid transfer port for providing one of the separate flows of the fluid relative to the surface of the wafer, the separate flow of the fluid relative to each fluid transfer duct being substantially uniform with respect to all of the other separate flows of the fluid provided by all of the other fluid transfer ducts of the unit. The plurality of fluid transfer ducts and the upper plurality of flow channels define the only separate flows in the block that are solely in the fluid transfer direction.

In still another embodiment, a method for making a proximity head for use in delivering fluids to a surface of a semiconductor wafer is disclosed. The method includes: (a) forming a first block from a plastic material, the first block extending a length that is at least as large as a diameter of the semiconductor wafer; (b) forming a main bore in the first block, the main bore being aligned with the length; (c) forming a plurality of upper intermediate bores in the first block, the plurality of upper intermediate bores being substantially perpendicular to the main bore and having a first ends connected to the main bore; (d) forming a resistor bore in the first block, the resistor bore being along the length and parallel to the main bore, the resistor bore being coupled to the plurality of upper intermediate bores at second ends, the resistor bore configured to receive a resistor for impeding and condition a flow of fluid introduced into the main bore; (e) forming a plurality of lower intermediate bores in the first block, the plurality of lower intermediate bores having first ends connected to the resistor bore; (f) forming a fusing surface on the first block, the fusing surface exposing second ends of the plurality of lower intermediate bores; (g) forming a second block with a fusing surface, the second block having delivery bores that communicate with the second ends of the plurality of lower intermediate bores of the first block; and (h) fusing the first and second fusing surfaces of the first block and second block, the second block having a proximity surface that is opposite the fusing surface, such that the proximity surface is configured to be placed in proximity to a surface of the semiconductor wafer for substantially even flow of fluid across the length.

It should be understood, however, that the method operations need not be performed in this particular order, and some steps may by combined. Additionally, the method steps of forming can take on many well known mechanical operations, such as shaping, machining, cutting, drilling, carving, hogging-out, sanding, polishing, melting, heating, aligning, etc., and the like.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 4B is a cross-sectional view taken on line 4B-4B in FIG. 4A, showing an exemplary configuration of the return flow conditioning unit of FIG. 4A, illustrating an exemplary rectangular cross-section of the resistor of this unit;

FIG. 4C is an end view of the exemplary configuration of the return flow conditioning unit of FIG. 4A;

FIG. 4D is a plan view of the configuration of the resistor of the return flow conditioning unit shown in FIG. 4A;

FIG. 5B is a cross-sectional view of the resistor of the unit shown in FIG. 5A, showing an exemplary circular configuration of the resistor of this unit;

FIG. 5C is an end view of the exemplary configuration of the resistor of the supply flow conditioning unit of FIG. 5A;

FIG. 5D is a perspective view of the configuration of the resistor of the supply flow conditioning unit shown in FIG. 5A;

FIG. 7C is a plan view of the two cooperating units shown in FIG. 7B, illustrating the end unit turning a corner and having the low pressure applied via the by-pass bore;

DETAILED DESCRIPTION

Several exemplary embodiments are disclosed, which define examples of conditioning fluid flow in a proximity head. The examples relate to fluid transfer relative to the head, and in one example fluid is delivered to a surface of a wafer, and in another example fluid is received from a wafer surface. In these examples, head rigidity is maintained even as the head is lengthened to enable cleaning of wafers having large diameters. Also in these examples, the proximity head is configured to maintain head rigidity by a one-piece head configuration, while defining a main fluid flow and defining separate flows of fluid relative to the wafer surface. To provide the conditioned flows from and into the head, the proximity head is configured with many structures configured according to low tolerances, and with reduced numbers of structures configured according to high tolerances. A structure configured according to high tolerances includes a flow resistor unit configured in the head to provide a highest flow resistance path between the main fluid flow and the respective plurality of inlet and outlets ports. With respect to a respective highest flow resistance flow path, there are separate flows in fluid transfer flow paths, e.g., into the inlet ports or from the outlet ports. For fluid conditioning, with a head surface configured for placement in a substantially parallel orientation with the wafer surface, fluid flowing in the head for the fluid transfer is substantially conditioned, and as a result the flow rate of the flow into each inlet port, and the flow rate from each outlet port, is enabled to be substantially uniform relative to the flow rates in the other respective inlet or outlet ports that are across the increased length of the head.

Several inventive embodiments of the present invention (herein referred to as "embodiments") are described below. It will be apparent to those skilled in the art that the present invention may be practiced without some or all of the specific details set forth herein.

The word "wafer," as used herein, denotes without limitation, semiconductor substrates, hard drive disks, optical discs, glass substrates, flat panel display surfaces, liquid crystal display surfaces, etc., on which materials or layers of various materials may be formed or defined in a processing chamber, such as a chamber in which a plasma is established for processing, e.g., etching or deposition. All such wafers may be processed by the embodiments in which improved cleaning systems and methods provide efficient wafer cleaning while reducing the likelihood of contaminants remaining on the wafer surface from dried liquid droplets.

Orientation of the wafer (and of structures) is described herein in terms of orthogonal X, Y and Z axes. Such axes may define directions, such as directions of surfaces or of movements or of planes, etc.

The word "fluid", as used herein, refers to liquids and gases.

Figure 1A:
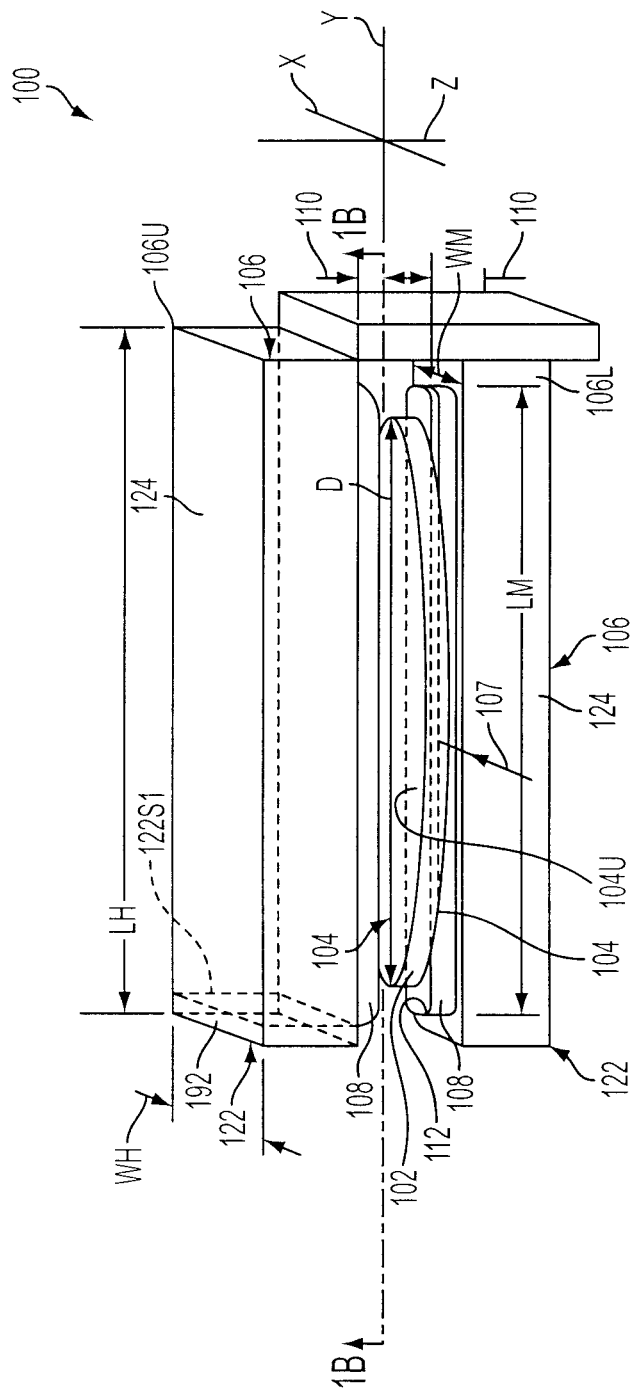
FIG. 1A is a perspective view of an embodiment of the present invention showing apparatus including proximity heads for meniscus processing of a wafer, in which the apparatus and the wafer are moved relative to each other.

The word "meniscus," as used herein, refers to a volume of liquid bounded and contained in part by surface tension of the liquid. In the embodiments, the meniscus in a contained shape can be moved relative to a surface. The "surface" may be a surface of a wafer ("wafer surface"), or a surface of a carrier ("carrier surface") that mounts the wafer, for example. The term "W/C surface" refers collectively to the wafer surface and the carrier surface. A desired meniscus for meniscus processing is stable. The stable meniscus has a continuous configuration. This configuration is continuous completely across a desired width (see WH below, FIG. 1A) in the X direction and across a desired length (see LM, FIG. 1A) in the Y direction and the meniscus extends continuously across a desired gap in the Z direction (FIGS. 1A & 1C). In specific embodiments, the meniscus may be established to be stable in this continuous configuration by the delivery of liquids to the W/C surface while also removing the liquids from the W/C surface. The removal may be by applying reduced pressure to the meniscus, and is referred to as "return".

The term "proximity head", as used herein, refers to an apparatus that can receive liquids, apply the liquids to the W/C surface, and remove the liquids from the W/C surface, when the proximity head is placed in close relation to the W/C surface. The close relation is when there is a small (e.g., 0.5 mm) gap between (i) a carrier surface (or the wafer surface) and (ii) a surface ("head surface") of the proximity head that applies the meniscus to the W/C surface. Thus, the head is spaced by the gap from the W/C surface. In one embodiment, the head surface is placed substantially parallel to the wafer surface and substantially parallel to the carrier surface. In one embodiment the proximity head is configured to supply a plurality of liquids to the gap and is also configured with vacuum ports for removing the supplied liquids.

The term "placed in close relation to" refers to "proximity" of the head surface and the W/C surface, the proximity being defined by the gap. The gap is a proximity distance measured in the Z direction. Different degrees of proximity are possible by adjusting the relative Z direction positioning of the carrier and the head surface. In one embodiment, exemplary proximity distances (gaps) may be between about 0.25 mm and about 4 mm, and in another embodiment may be between about 0.5 mm and about 1.5 mm, and in a most preferred embodiment the gap may be about 0.5 mm.

By controlling the delivery to, and removal of the liquids from, the meniscus, the meniscus can be controlled and moved relative to the W/C surfaces. During the processing the wafer may be moved, while the proximity head is still. The head may also be moved while the wafer remains still. Further, for completeness, it should be understood that the processing can occur in any orientation, and as such, the meniscus may be applied to W/C surfaces that are not horizontal (e.g., carriers or wafers that are at an angle to horizontal). A preferred embodiment is described in which: (i) the wafer is moved by the carrier in the X direction, (ii) a desired orientation of the W/C surfaces is horizontal and parallel to the head surface (i.e., in an X-Y plane), (iii) the proximity head is still, (iv) the length LH of the head surface extends in the Y direction across the W/C surface and is passed by the carrier and wafer moving parallel to the X direction, (v) the head surface and the W/C surface are spaced by a desired gap having a uniform value (i.e., uniform in the Z direction across the entire X and Y direction extents of the gap), and (vi) the meniscus is stable and extends in a continuous configuration (i.e., without separation) across the gap and thus extends continuously in each of the X, Y & Z directions across the gap.

The term "recipe" refers to computer data, or information in other form, that defines, or specifies, (1) process parameters for a desired meniscus process to be applied to the wafer; and (2) physical parameters related to establishing the gap. For the liquid or liquids that define the meniscus, the process parameters can include the type of liquid, and the pressures, flow rates and chemical properties of the liquid. For the meniscus, the process parameters can include the size, shape and location of the liquid meniscus.

The word "chemistry", as used herein, refers to a particular combination of the fluids specified by the recipe for meniscus processing of a given type of wafer; and involves physical and chemical properties of such fluids and of the materials from which the meniscus processing apparatus is fabricated. Generally, for a particular type of wafer, a specific chemistry is specified by the recipe for the meniscus processing. In turn, the configuration of the meniscus processing apparatus must be compatible with that specific chemistry.

The word "tolerance", as used herein, may be understood as relating to "configuring" the proximity head, or to how the head is "configured", as described below. In one example, a "nominal dimension" is an ideal, exact dimension to be achieved by the configuring. When a specification for a configured feature (or structure) requires only the nominal dimension to be achieved, the configured feature is said to be "according to" a "zero tolerance". In another example, the configured feature may be specified to require achievement of either (i) the "nominal dimension", or (ii) a dimension somewhat different from the exact nominal dimension. The difference between the nominal (or exact) dimension and the permitted different dimension, is referred to as a "tolerance". When the tolerance is limited to small amounts of difference the tolerance is said to be "high"; is generally difficult, or expensive, to achieve; and the configuring is said to be "according to a high tolerance". When the tolerance is less limited, and the specification permits larger amounts of difference the tolerance is said to be "low"; is generally easier, or less expensive, to achieve; and the configured feature (or structure) is said to be "according to a low tolerance". Such "high" tolerances may be expressed in terms of a percentage, for example. The percentage may be defined by the small amount of the difference divided by the nominal dimension. Such "low" tolerances may also be expressed in terms of a percentage, for example. The percentage may be defined by the larger amount of the difference divided by the nominal dimension. When many high tolerances are specified, the configured features (or structure(s)) are said to be "according to high tolerances". When many low tolerances are specified, the configured features (or structure(s)) are said to be "according to low tolerances". In other examples, the dimension to be configured may be a diameter of a hole or bore, or a length of a piece, or a direction. The same criteria apply to a nominal one of such dimensions, and to the low and high tolerances relating to such dimensions.

Design Considerations

Analysis by the Applicants of the present invention indicates that one problem in the use of a recipe-controlled meniscus defined between the proximity head and the W/C surface to be processed may be overcome by the embodiments. The problem is the trend in semiconductor chip manufacturing to use wafers having greater and greater diameters. For example, the diameters have ranged from the early 25.4 mm diameter through much iteration to the later 200 mm diameter that in 2007 is being displaced by 300 mm diameter wafers, and in 2007 predictions are for use of a 450 mm diameter, e.g., by 2013. When the proximity head spans a Y direction distance more than the wafer diameter, and when the wafer diameter becomes larger and larger, the meniscus length LD must become longer and longer in the Y direction so as to process the entire wafer in one relative motion between the proximity head and the wafer. The analysis also indicates that the problem relates to a desire to increase throughput of wafers processed by such a meniscus, e.g., to increase the speed of movement of the wafer relative to the proximity head during meniscus processing. With increases in both meniscus length and the relative speed, such Applicants have identified the uniformity of the flow rate of fluids that define such a meniscus as being related to obtaining desired results of the meniscus processing. The analysis by such Applicants indicates needs for a system for conditioning fluid flow, e.g., for flow introduced into a proximity head for delivery to a surface of a wafer and for flow of fluid removed from the wafer surface into the proximity head.

This analysis by such Applicants indicates that the need for conditioning fluid flow may be filled by a proximity head configured in one piece, yet configured to define flow paths that (i) introduce fluid into the proximity head for delivery to the wafer surface, and (ii) remove fluid from the surface of the wafer. The need is filled for exemplary flows into the head via one fluid transfer unit, by configuring the head so that in each of many flow paths of the unit into the head there is substantially the same flow rate across the length of the head. Also, such configured head still maintains head rigidity even if the head is lengthened for cleaning of wafers with larger and larger diameters. To provide the conditioned flows from and into the head, this analysis by these Applicants also indicates that the head should be configured to increase the number of head structures that are configured according to low tolerances, and to limit, or reduce, the number of head structures that are configured according to high tolerances. Also, the structure configured according to high tolerances should be limited to performing fluid conditioning.

Structure Configurations

With the above design considerations in mind, reference is now made to exemplary structure configurations for filling the above and other needs, which will enable obtaining desired results of the meniscus processing notwithstanding (i) increases in both (a) wafer diameter (thus meniscus and head length increases) and (b) head-to-wafer relative speed, and (ii) limitations imposed by the chemistry that may be specified by the recipe for a particular meniscus processing. In a flow conditioning unit, the desired results to be obtained provide substantial uniformity of the flow rate of fluids that are relative to the unit. Thus, in one example, the flow rate of the flow into each inlet port of one fluid transfer unit is enabled to be substantially uniform relative to the flow rates in the other inlet ports of the unit that are spaced across the increased length of the head. In each case the substantial uniformity must be across the length of the proximity head. Also, in each fluid transfer unit the configuring according to the high tolerances is limited to one high resistance flow path and to flow paths adjacent to the one high resistance flow path, including one flow path leading to a fluid transfer surface of the proximity head. This configuring is effective to render the respective flow rates of the fluid relative to the fluid transfer surface substantially uniform across the length of the head that is opposite to the wafer, even though a plurality of other structures of the one fluid transfer unit are configured according to the low tolerances.

FIG. 1A shows apparatus 100 for meniscus processing of a wafer 102, in which the apparatus 100 and the wafer 102 are moved relative to each other. Each of two opposite sides, or surfaces, 104 of the wafer may be processed by a separate proximity head 106. Exemplary relative movement is shown in which the proximity heads are stationary and the wafer 102 is moved past the proximity heads 106 (arrow 107). The heads 106 are shown straddling the wafer 102 such that the wafer sides 104 are processed at the same time. The above-described problems arising from increases in the wafer diameter D may be understood in that the heads 106 are illustrated as extending completely across and past the wafer diameter D. Thus, as the wafer diameter D increases, the length LH of the heads 106 must be increased. For reference, the head length LH is shown in a Y axis direction. An upper head 106U is shown above a lower head 106L and is shown spaced in a Z axis direction from the lower head 106L. The exemplary movement 107 of the wafer 102 past the heads 106 is shown as movement in an X axis direction. Each head 106 is configured to establish a meniscus 108 that spans a gap 110 between the respective head to the respective surface 104. The increases in the length LH increase the structural rigidity required for the head 106 to span the length LH without sagging, for example. Sufficient structural rigidity is required to maintain the gap 110 uniform across that length LH. The meniscus 108 extends in the three X, Y and Z directions. Thus, FIG. 1A shows the meniscus 108 extending from the upper head 106U in the Z direction to an upper wafer surface 104U. The meniscus is also shown having a length LM extending completely across and past the wafer 102 in the Y direction. Looking down on the heads 106, the upper surface 104U of the wafer 102 is shown. A width WH of the upper head 106U and a width WM of the meniscus 108 are shown, with both widths extending in the X direction.

Figure 1B:
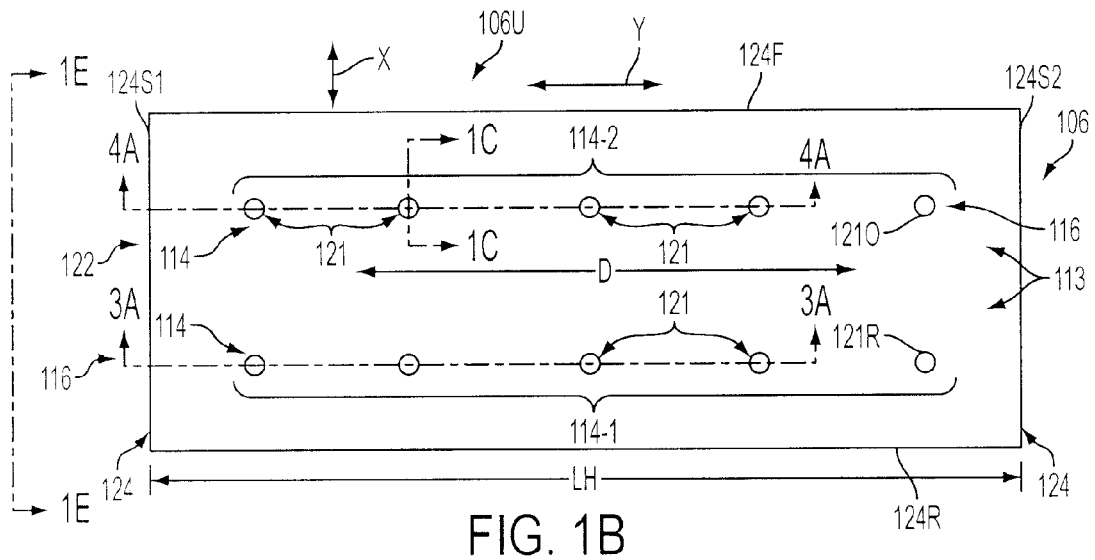
FIG. 1B is a plan view taken on line 1B-1B in FIG. 1A showing an upper one of the proximity heads, illustrating flow conditioning units.
Figure 1C:
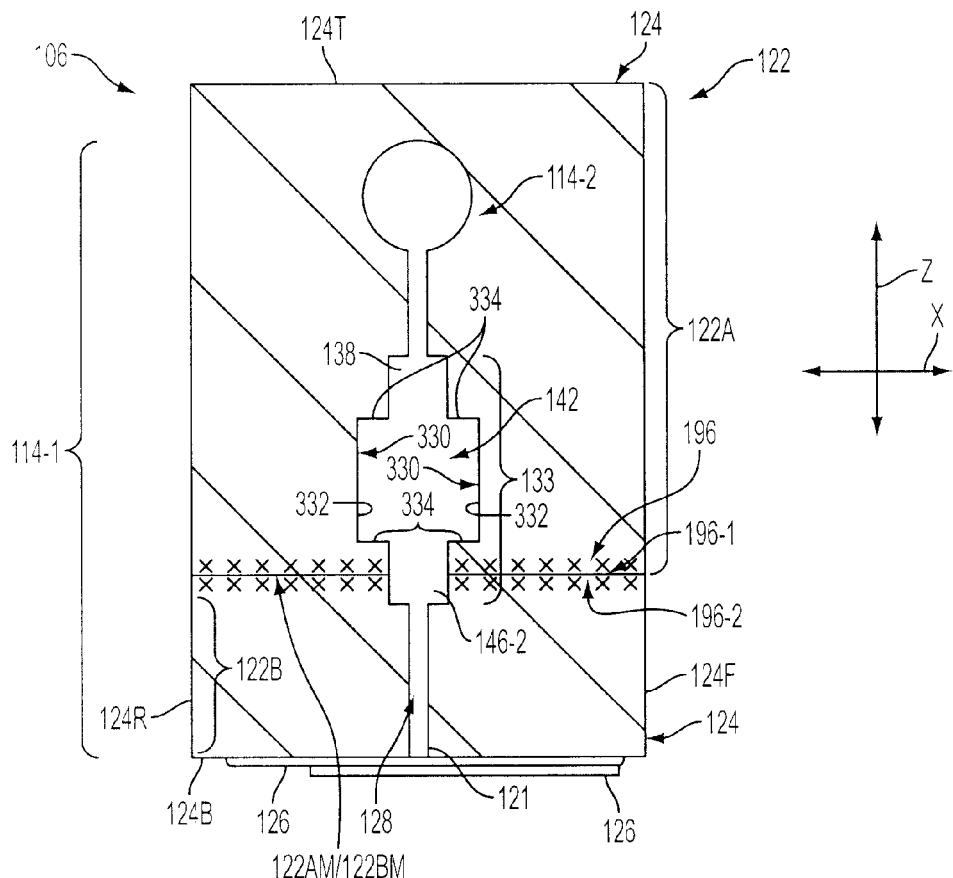
FIG. 1C is a cross-sectional view taken on line 1C-1C in FIG. 1B, showing an underside of an upper one of the proximity heads, illustrating an exemplary embodiment of the present invention in which the fluid conditioning units are configured in the proximity heads.

FIG. 1B is a view looking upwardly, from just above the meniscus 108 and onto one embodiment of the upper head 106U, illustrating an exemplary arrangement, or network, 113 of fluid conditioning units, or channels, 114. In the network 113 each exemplary fluid conditioning unit 114 extends in a row 116 in the Y direction of the length LH of the head 106. For reference, the diameter D of the wafer 102 is also indicated. Exemplary embodiments of the units 114 are identified as units 114-1 & 114-2 (see brackets indicating extent of the units). The unit 114-1 is shown extending in a row 116 partly across the length LH of the head 106, and extending beyond the diameter D of the wafer 102, and is a supply unit as described below. Unit 114-2 extends similarly, but is a return unit as described below. To enable the head 106 to establish the meniscus 108 that spans the gap 110 between the respective head 106 and the respective surface 104, the units 114-1 & 114-2 are shown configured with ports, or fluid transfer ports, 121 each in an exemplary circular configuration through which fluid is transferred to establish the meniscus 108. Fluid is either supplied to the head 106 and through and out of the ports, referred to as outlet ports 121O, or the fluid is drawn through and into the ports 121, referred to as return ports 121R, and is drawn into the head 106. Still generally, to promote a stable meniscus the units 114 are configured so that fluid flowing for delivery to the wafer surface 104, and fluid flowing for collection from the wafer surface, is "substantially conditioned". In detail, the configuration of the units 114 is such that the fluid is "substantially conditioned" for each type of fluid flow of the respective unit 114, i.e., supply and return. Fluid that is substantially conditioned in the unit 114 of the head 106 is characterized by uniform fluid flow rates in two respects: (i) uniform outflow rates from the plurality of outlet ports 121O, e.g., of a row 116 of the supply unit 114-1 to the wafer surface 104, and (ii) uniform inflow rates from the wafer surface 104 into the plurality of return ports 121R, e.g., of a row 116 of the return unit 114-2. Whether the flow rates of the fluid through each of the ports 121 of the one unit 114-1 or 114-2 are "uniform" is determined as described below. "Uniformity" of the flow rates through the ports 121 of one unit 114 is defined by three factors. Supply unit 114-1 is used as an exemplary unit in describing uniformity. One factor, average flow rate ("AFR"), is composed of the total flow rate ("TFR") through all ports 121 of the exemplary unit 114-1 (e.g., in ounces per minute), and the TFR is divided by the number of ports 121 in the exemplary unit 114-1. A second factor is the value of the maximum flow rate through any of the ports 121 in the exemplary unit 114-1, and is identified as "MAX". The third factor is the value of the minimum flow rate through any of the ports 121 in the exemplary unit 114-1, and is identified as "MIN". Uniformity ("U") is based on these three factors as follows:

$$U = [MAX - MIN/AFR] \times 100 \quad \text{[Equation 1]}$$

In a general sense applicable to supply of gas and liquid by an exemplary unit 114-1, and to return via a vacuum by an exemplary unit 114-2, a "uniform" flow rate through each port 121 of the exemplary unit 114 is indicated by a zero value of Equation 1. Fluid having this zero value of Equation 1 has been "conditioned", i.e., has been ideally conditioned in the unit 114-1. Also in a general sense applicable to supply of gas and liquid by an exemplary unit 114-1, and to return via a vacuum by an exemplary return unit 114-2, fluid having a value of Equation 1 other than zero, and as described below, is said to have been "substantially conditioned". The value of Equation 1 in the ranges described below indicates that the flow rate of such fluid flowing through each such port 121 of the unit 114-1 is substantially uniform relative to the flow rates of fluid flowing in all of the other ports 121 of the exemplary unit 114-1.

More specifically, the range of values of Equation 1 corresponding to flow rates that are "substantially uniform" through each port 121 of the exemplary unit 114, is determined with respect to the fluid that is being transferred by that unit. For example, in one embodiment of a return unit 114 in which a vacuum applied to the head 106 induces the return, the value of Equation 1 (i.e., uniformity) was determined to be about 6%, which compares to about 14% in a return head 106P described below. For such return unit 114 of an embodiment, flow rates that are substantially uniform may have a value of Equation 1 in a range from about 9% to about 4%, for example. As another example, in one embodiment of a supply unit 114 of an embodiment in which N2/IPA was supplied to the head 106, the value of Equation 1 (i.e., Uniformity) was determined to be about 3%, which compares to about 5% in a supply head 106P used for the same N2/IPA and described below. For such supply unit 114 of an embodiment, flow rates that are substantially uniform may have a value of Equation 1 in a range from about 2% to about 4%, for example. As another example, in one embodiment of a supply unit 114 in which water was supplied to the head 106, the value of Equation 1 (i.e., Uniformity) was determined to be about 0.7%, which compares to about 3% in a supply head 106P used for water as described below. For such supply unit 114 of an embodiment, flow rates that are substantially uniform may have a value of Equation 1 in a range from about 0.5% to about 2%, for example. The heads 106P noted above were not configured as embodiments, and had the following characteristics: (a) many levels of branches in which a main plenum branched into a few flow paths, and each of the few flow paths branched into a small number of flow paths, and those flow paths again branched in a similar manner; (b) the flow paths were each configured according to a high tolerance; (c) four or more separate pieces of the head were required to enable configuration of the many series of branches of the flow paths; and (d) the separate pieces were held together by fasteners.

Other aspects of the configuration of the units (or channels) 114 may be initially understood from FIGS. 1A-1C. In combination these Figures show the head 106 configured as a one-piece block, or polyhedron, 122. The block 122 may be one solid, three-dimensional piece having, or bounded by, many faces 124. Generally, FIG. 1A shows the one-piece block 122 extending (i) in the Y direction of the head length LH; and (ii) in the Z, or fluid flow, or delivery or return, direction perpendicular to the head length direction Y; and (iii) in a width direction WH (the direction X) perpendicular to the Y and Z directions. An exemplary block 122 may be configured as a rectangular parallelepiped. Other exemplary blocks 122 may be configured with faces 124 arranged as may be required for the functions performed by the various units 114. In one embodiment, the block 122 is defined by the faces 124 that are a plurality of mutually perpendicular exterior faces 124.

Referring also to the cross-sectional view of FIG. 1C, the upper head 106U is shown with one bottom face 124B, and in use such face is oriented opposite to the wafer surface 104 for the processing. Face 124B may be composed of flat surfaces 126. One top face 124T is opposite to the bottom face 124B. FIG. 1B shows opposite side faces 124S1 and 124S2 define the head length LH. FIG. 1C shows one front face 124F is first passed by the wafer 102 as the wafer approaches (arrow 107) the head 106 for processing, and one rear face 124R is passed by the wafer as the wafer leaves the head 106 after processing. Exemplary values of the gap may be about 0.70 mm from one flat face 126 near the front face 124F and about 0.78 mm from another flat face 126 near the other face 124R (FIG. 1C).

In a preferred embodiment, the block 122 of each head 106 is fabricated from a material having high strength properties capable of spanning the wafer 102 as required to enable the flat surfaces 126 to remain spaced from the wafer surface 104 within a moderate range of gap values. A more preferred embodiment is provided when the material from which the block 122 is configured is required to: (i) have the highest strength properties capable of spanning the wafer 102 as required to enable the flat surfaces 126 to remain properly spaced from the wafer surface 104; (ii) be compatible with meniscus processing chemistry in which the fluids include N2 and IPS and water; and (iii) provide a narrowest range of uniformity of fluid flow rates, and thus the desired substantial uniformity as defined above. This more preferred embodiment is configured with the block 122 of each head 106 fabricated from one piece of the material described below. In this more preferred embodiment, the exemplary materials may be poly vinylidine di-fluoride (PVDF), or ethylene-chlorotrifluoroethylene (ECTFE) such as that sold under the trademark Halar.

FIG. 1C, a cross-sectional view, shows that in one embodiment (of unit 114-2) the fluid may be transferred in a plurality of fluid transfer flow paths 128 that are open to the ports 121. The fluid transfer flow path 128 shown is thus of the exemplary unit 114-2, and unit 114-2 is shown extending in the Z direction. As described above, in that unit 114-2 the flow in one such path 128 (e.g., each path 128 that is across the diameter D of the wafer 102), is at a flow rate that is "substantially uniform" (as defined above) relative to flow rates in the other paths 128 of the same exemplary unit 114-2. That is, the flow rate in each path 128 of the unit 114-2 that is opposite to the diameter D of the wafer 102, is at a flow rate that is substantially uniform relative to the flow rates in the other paths 128 of the unit 114-2 that are also opposite to the diameter D of the wafer 102.

Figure 1D:
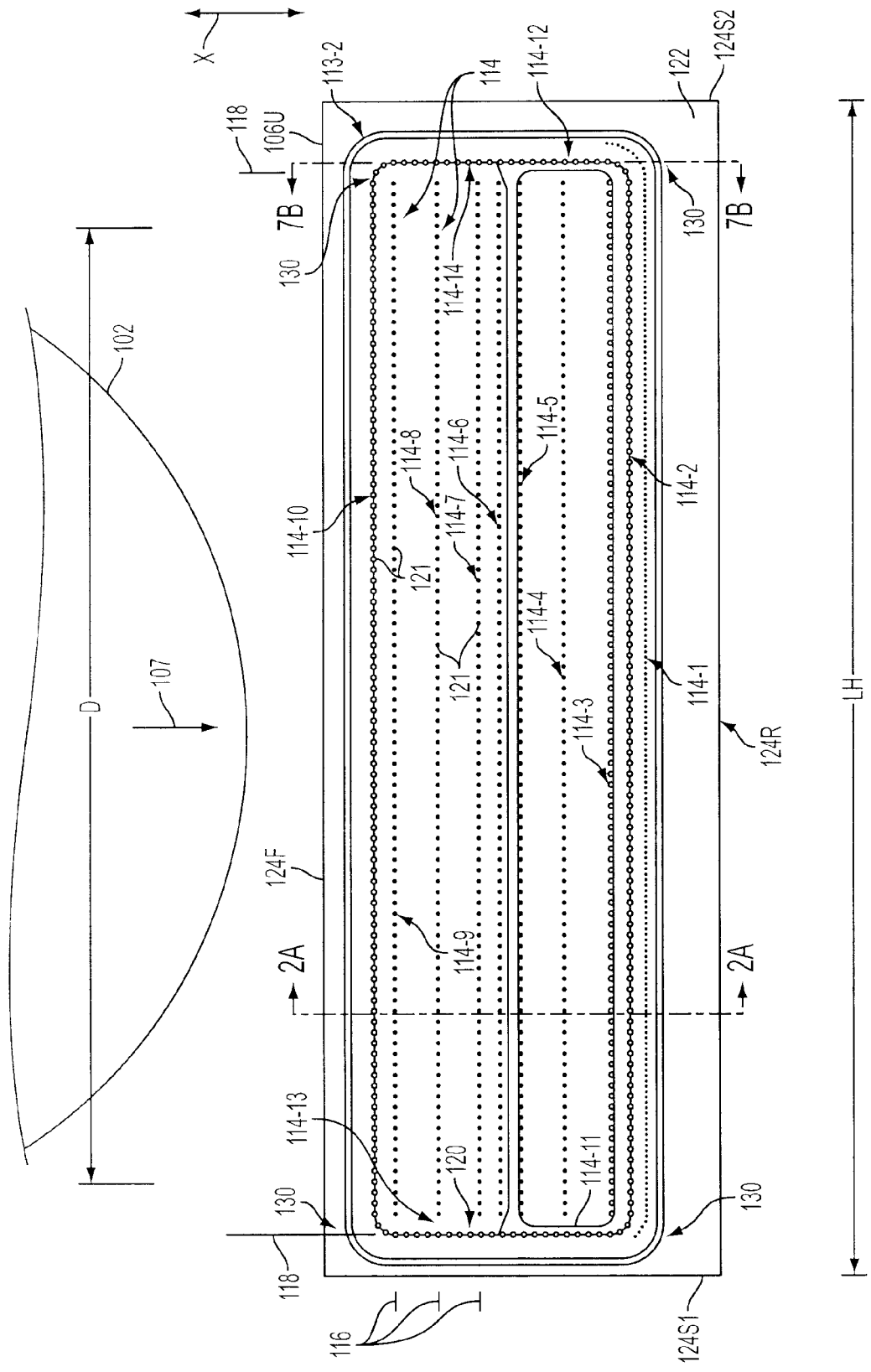
FIG. 1D is a plan view similar to FIG. 1B showing an upper one of the proximity heads, illustrating a complete set of flow conditioning units.

Another embodiment may be understood by reference to FIG. 1D. FIG. 1D is a view looking upwardly at this embodiment from just above the meniscus 108 and onto the upper head 106U, also illustrating an exemplary arrangement, or network, 113-2 of fluid conditioning units, or channels, 114. In FIG. 1D, embodiments of the units 114 are identified as units 114-1 through 114-14. For clarity of illustration, the ports 121 of the units 114 are shown as dots or small circles, but are as described below. Each such unit 114-1 through 114-10 extends in one of the rows 116 partly across the length LH of the head 106 and extends beyond the diameter D of the wafer 102. In the embodiments of the unit 114 identified as units 114-2 and 114-10, each of these units extends in a row 116 further across the length LH of the head 106, beyond the diameter D of the wafer 102, and beyond the units 114-3 through 114-9. In the network 113, unit 114-2 is also shown joining units 114-11 and 114-12 that extend in the X direction in a column (see line 118). Unit 114-10 is also shown joining units 114-13 and 114-14 that also extend in the X direction in the column (see line 118). The respective joined units 114-2, 114-11 & 114-12, and 114-10, 114-13, and 114-14, combine to surround, and to define an enclosure 120 around, the inner units 114-2 through 114-8. A last of the exemplary arranged units 114 is shown as the unit 114-1 extending outside of the enclosure 120, in the Y direction of the length LH of the head 106, in a row 116.

Figure 1E:
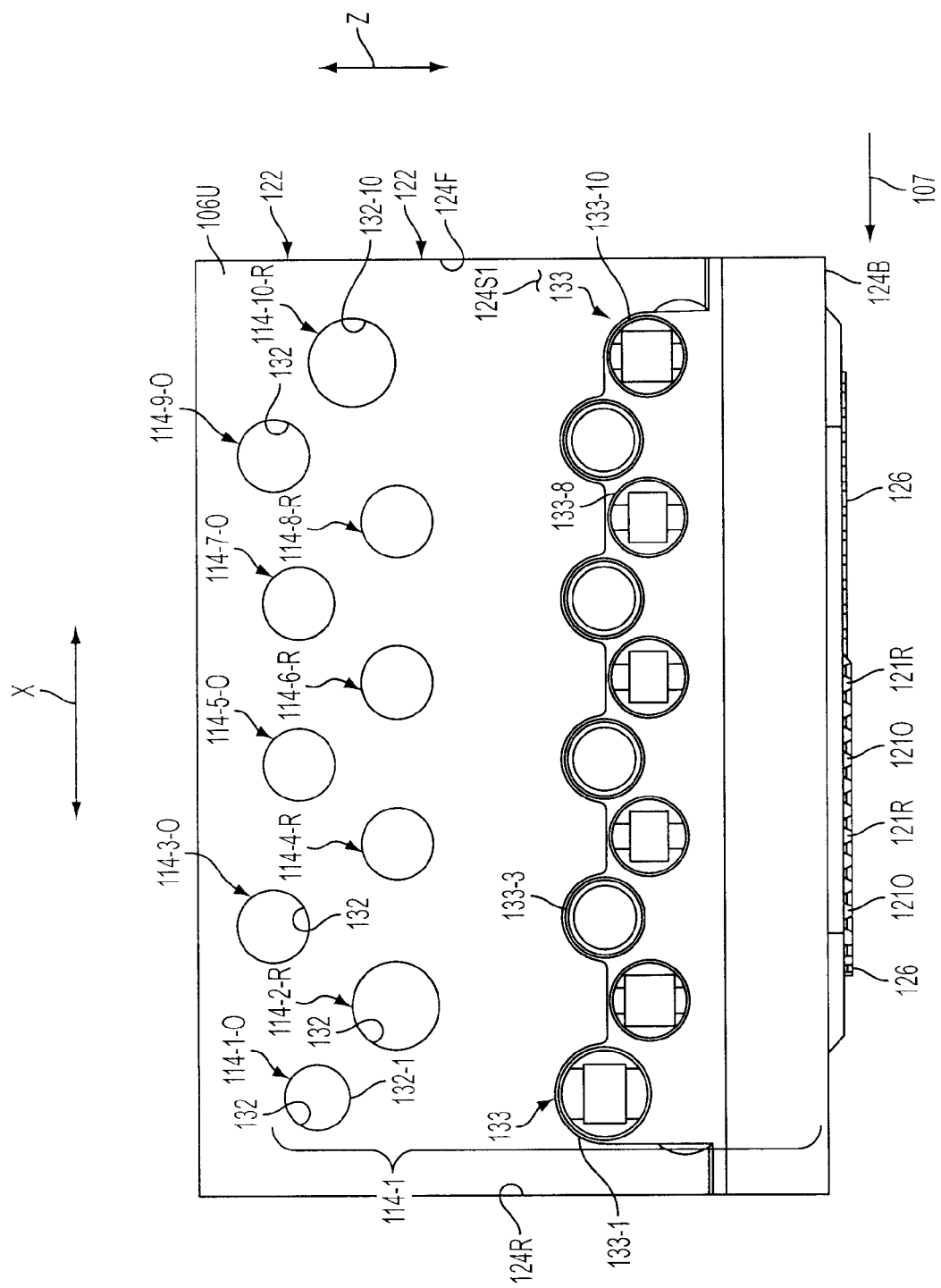
FIG. 1E is an end view of the fluid conditioning units shown in FIG. 1D, showing main bores and resistive units extending through one end of one of the proximity heads.

FIG. 1E shows an elevation view of one embodiment of end 124S1 of the block 122. As compared to the cross-sectional view of FIG. 1C (that shows the units 114 extending in the Z direction within the block 122), less structure of the units 114 extends through the block 122 to the end 124S1. The Z extent of a representative unit is shown in FIG. 1E by bracket 114-1.

Other units are identified without a bracket, and extend similarly in the Z direction. As described above, some of the units 114 may be configured, for example, with the outlet ports 1210. These units may be referred to as fluid supply conditioning units. FIG. 1E identifies these units as: 114-1-O, 114-3-O, 114-5-O, 114-7-O, and 114-9-O, and all supply liquid to the meniscus 108. Also, the others units 114 may be configured, for example, with the return ports 121R. These units may be referred to as fluid return conditioning units. FIG. 1E identifies these units as: 114-2-R, 114-4-R, 114-6-R, 114-8-R, and 114-10-R, and all draw fluid into the head 106. The ports 121 combine to establish and maintain the meniscus 108 extending relative to the wafer 102 as described above.

As illustrated by the rows 116 of ports 121 shown in FIG. 1D, the units 114 also extend into the block 122 from the face 124S1. Each of the units 114 is the same, except as described below with respect to length, location and configuration in the block 122, proximity to corners 130 (FIG. 1D) of the block, proximity to a face 124S1 or 124S2, or the particular function performed (fluid supply or return), for example. As a preface to describing one unit 114 as representing the common configuration of all of the units 114, reference is again made to face 124S1 shown in FIG. 1E. The face 124S1 is shown configured with the exemplary ten units 114-1 through 114-10, here also identified by a "-O" or a "-R" as noted above. Each such unit 114-1 through 114-10 includes a main bore 132 that extends through the face 124S1 and into the block 122 in the Y direction, with a few representative bores 132 identified. FIG. 1E shows an exemplary spaced arrangement of the ten exemplary bores 132, which is staggered and extends in the X direction. Main bore 132-1 is shown near the rear face 124R and main bore 132-10 is shown near the front face 124F. For clarity of illustration, other main bores 132-2 through 132-9 that are between bores 132-1 and 132-10 are not separately identified. The bores 132-1, 132-3, 132-5, 132-7, & 132-9 may be referred to as main outlet bores in that they supply the outlet ports 1210. The bores 132-2, 132-4, 132-6, 132-8, & 132-10 to 132-14, may be referred to as main return bores in that they cause return flow into the return ports 121R. Generally, a desired fluid is introduced into each of the main outlet bores 132-1, 132-3, 132-5, 132-7, & 132-9. Still generally, each of the respective units 114-1-O, 114-3-O, 114-5-O, 114-7-O, & 114-9-O is configured so that fluid flowing from the respective main outlet bore 132 for delivery to the wafer surface 104 is substantially conditioned, wherein the conditioned fluid provides the substantially uniform fluid outflow from the plurality of respective outlet ports 1210 of the respective rows 116 of the units 114-1-O, 114-3-O, 114-5-O, 114-7-O, & 114-9-O to the wafer surface 104.

Similarly, it may be understood that a low pressure is applied to each of the main return bores 132-2, 132-4, 132-6, 132-8, & 132-10 through 110-14. Still generally, each of the respective units 114-2-R, 114-4-R, 114-6-R, 114-8-R, & 114-10-R through 114-14-R is configured so that fluid flowing, or drawn, into the respective return ports 121R of each such unit from the wafer surface 104 is substantially conditioned, and is at a substantially uniform fluid flow rate.

Still describing the common configuration of all of the fluid conditioning units 114, face 124S1 shown in FIG. 1E also illustrates another aspect of the configuration of the exemplary fluid conditioning units 114-1 through 114-10. Each such unit is shown including a resistor unit 133. Each unit 133 extends through the face 124S1 and into the block 122 in the Y direction. FIG. 1E shows an exemplary spaced arrangement of the exemplary resistor units 133, which is also staggered and extends in the X direction. The resistor units 133 are spaced in the Z direction from the main bores 132. Resistor unit 133-1 is shown near the rear face 124R and resistor unit 133-10 is shown near the front face 124F. For clarity of illustration, other resistor units 133-2 through 133-9 that are between resistor units 133-1 and 133-10 are not separately identified. Generally, a resistor unit 133 is configured for the function (i.e., outlet or return) of the respective fluid conditioning unit 114.

Figure 2A:
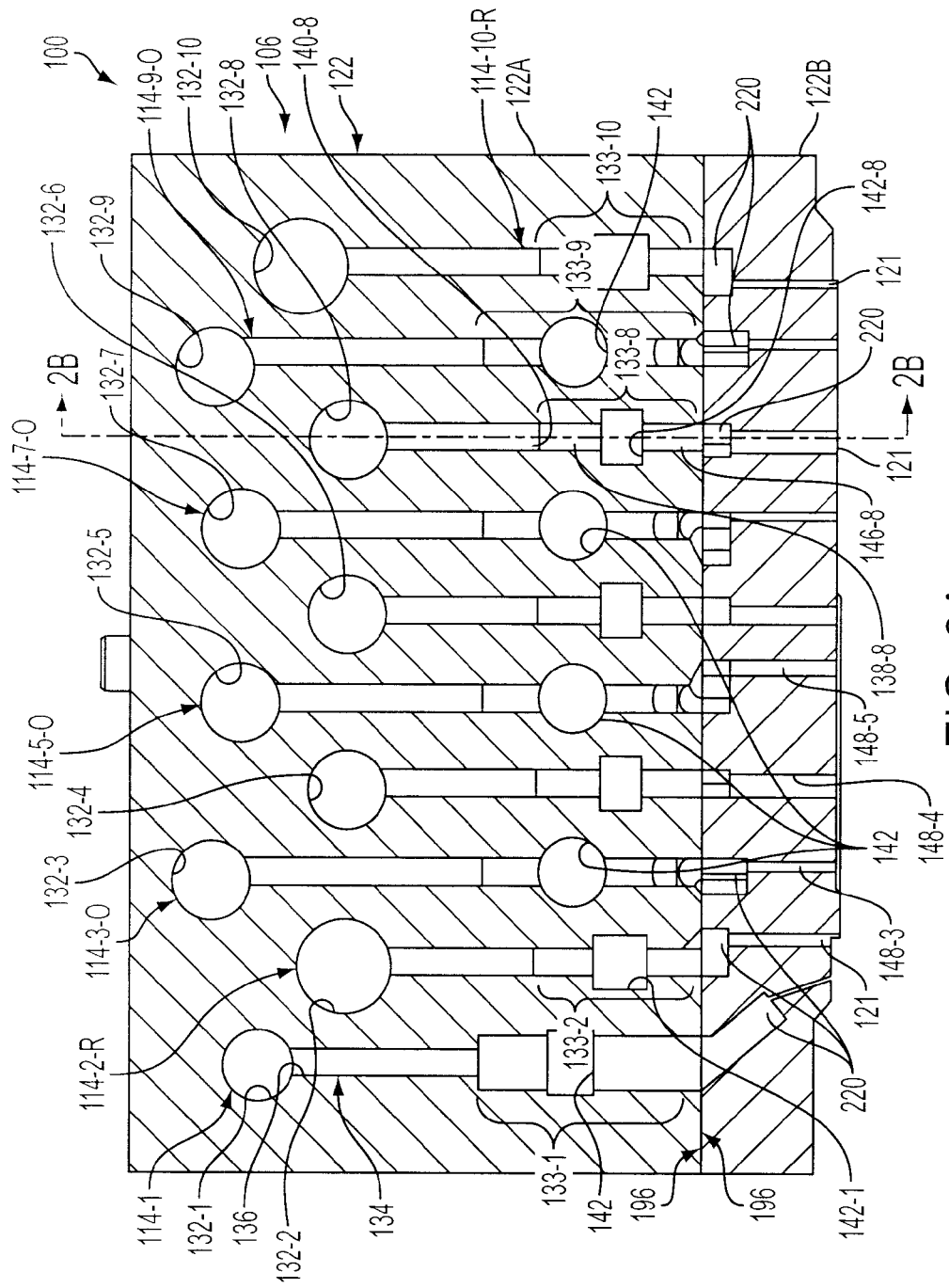
FIG. 2A is a cross-sectional view of the fluid conditioning units shown in FIG. 1E, showing the main bores and the resistive units connected to other bores to supply fluids to and receive fluids from the meniscus.

FIG. 2A is a cross section of the block 122 taken as shown in FIG. 1D, illustrating the cross sectional configuration of the exemplary flow conditioning units 114, including the respective resistor units 133, of the embodiment of FIGS. 1D & 1E. Main outlet bores 132-1, 132-3, 132-5, 132-7 and 132-9 alternate with main return bores 132-2, 132-4, 132-6, 132-8 and 132-10. Resistor units 133-1, 133-3, 133-5, 133-7, & 133-9 alternate with resistor units 133-2, 133-4, 133-6, 133-8 & 133-10, with five units 133-1, 133-2, 133-8, 133-9 & 133-10 being identified by brackets. The units 133 are shown schematically in FIGS. 2A and 3A, with details being described below.

Figure 2B:
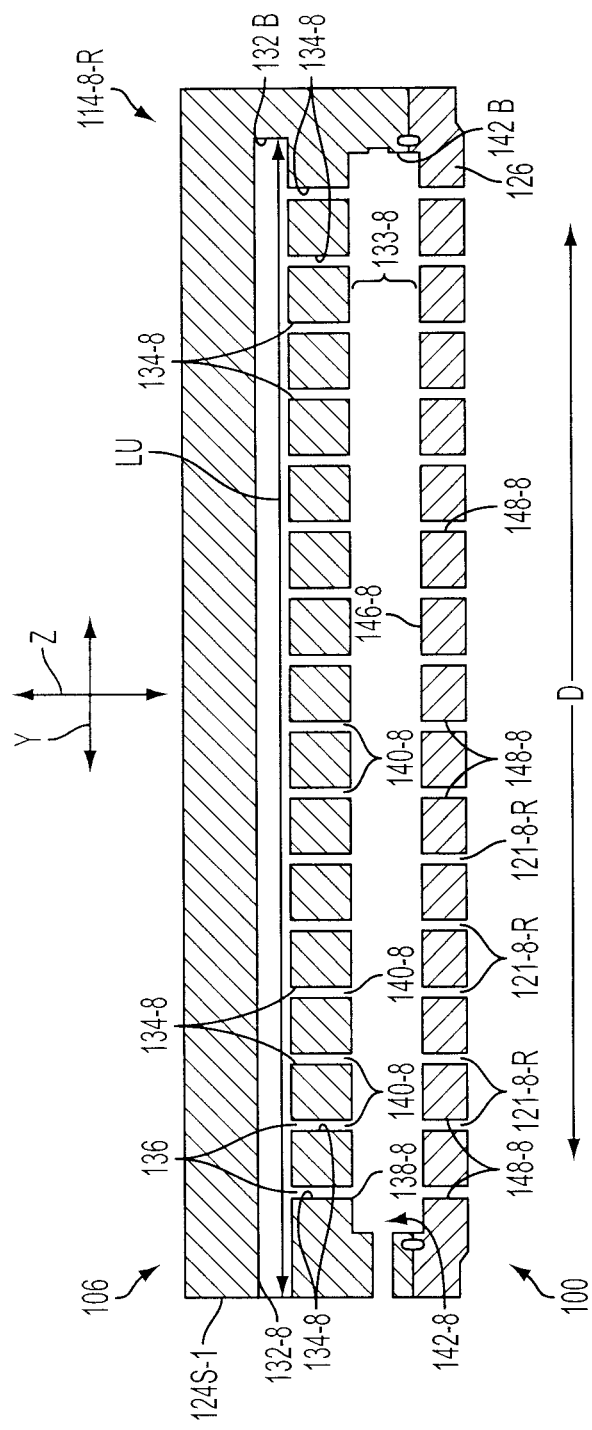
FIG. 2B is a cross-sectional view taken on line 2B-2B in FIG. 2A, showing an exemplary configuration of one flow conditioning unit extending in a direction of a wafer surface.

FIG. 2B is an elevation cross section view taken in FIG. 2A through the block 122, showing an exemplary one of the flow conditioning units 114, which is unit 114-8, that may be designated 114-8-R configured for return. Generally, the cross-sectional configuration of an outlet unit (e.g., 114-3-O) is similar to that shown in of FIG. 2B, such that the following description applies to the outlet units, except as noted. The main return bore 132-8 is shown at the top of the unit 114-8-R, and extends in the Y direction from the face 124S1 along unit length LU to a blind end 132B. For the return of FIG. 2B, the main return bore 132-8 is configured to initially receive the applied low fluid pressure, and low pressure is to be applied by the unit 114-8-R to the return ports 121R (or 121-8-R)_of the unit 114-8-R. For clarity of illustration, the fluid is not shown. Length LU of the main return bore 132-8 extends in the block 122 along part of the length LH (FIG. 1A) of the proximity head.

Figure 3A:
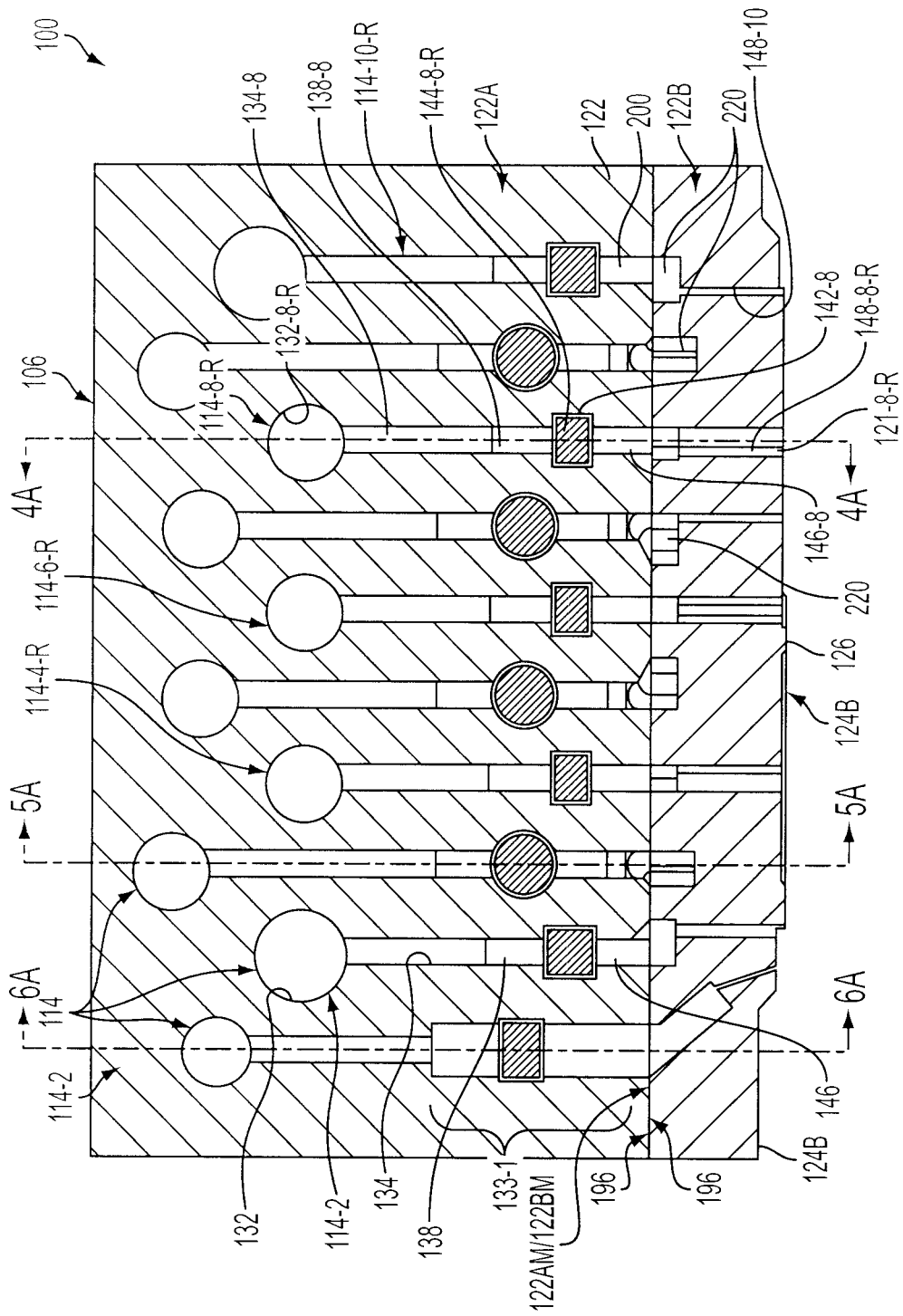
FIG. 3A is a cross-sectional view similar to FIG. 2A, showing the addition of resistors into the flow conditioning units to substantially condition fluids flowing in the units.

Generally, FIGS. 2A & 2B show a plurality of vertical fluid flow bores 134 having first ends 136 that are connected to the main return bores 132. For the unit 114-8, the plurality of vertical fluid flow bores 134-8 extend in the block 122 spaced from each other along the length LU and thus along part of the length LH of the proximity head 106. In the unit 114-8 and the related units 114-2, 114-4, 114-6, and 114-10, the bores 134 may be configured with an oval shape, in which the oval of a bore 134 extends to a greater extent in the Y direction of the bores that are further from the face 124S1. FIGS. 2A and 2B show an upper plenum 138-8 connected to second ends 140-8 of the plurality of bores 134, so that each vertical fluid flow bore 134-8 applies the low fluid pressure to the upper plenum 138-8. FIG. 2B shows the upper plenum 138-8 extending in the block 122 similar to the main return bore 132-8. In FIG. 2A, a resistor bore 142-8 of resistor unit 133-8 is shown in the block 122 and connected to the upper plenum 138-8. The resistor bore 142-8 is configured to receive a resistor 144-8 (see FIG. 4A for resistor 144-8 in bore 142-8 and extending in the Y direction). In the view of FIG. 3A the resistor 144-8-R is also shown in the bore 142-8. In the resistor unit 133-8, the resistor 144 is identified by 144-8 (or 144-8-R). Generally, each resistor 144 has a shape configured to limit flow of the fluid through the respective resistor bore 142, and the resistor 144 extends in the block 122 in the resistor bore 142 to a blind end 142B (FIG. 2B). FIGS. 2B and 3A show a lower plenum 146-8 in the block 122. The lower plenum 146-8 extends parallel to the main bore 132-8 and is connected to the resistor bore 142-8. The lower plenum 146-8 receives low pressure applied from the resistor bore 142-8 as limited by the resistor 144-8. A plurality of fluid transfer bores 148-8 (or 144-8-R)_ is defined in the block 122. The bores 148-8 are spaced similar to the vertical fluid flow bores 134-8, and extend in the Z direction between the lower plenum 146-8 and the flat surface 126 of the bottom face 124B. At the face 124B, each bore 148-8 terminates at a respective one of the fluid transfer ports (e.g., a return port) 121-8-R (FIG. 2B). The rows 116 in FIG. 1B are illustrated in FIG. 2B by the bores 148-8 terminating at the fluid transfer ports 121-8-R (some of which are shown schematically as dots in FIG. 1D).

Still generally, in reference to FIG. 3A, in operation applicable to all of the return units 114R (i.e., 114-2, 114-4, 114-6, & 114-8), as a result of the low pressure applied to the main return bore 132-8-R of the exemplary unit 114-8-R, fluid flowing from the return ports 121-8 through the lower plenum 148-8, the resistor bore 142-8 (in which the resistor 144-8 is received), and the upper plenum 138-8 to the main return bore 132-8, is substantially conditioned to define the substantially uniform fluid inflow rate into the plurality of return ports 121-8-R of unit 114-8-R from the meniscus 108. The substantially uniform fluid inflow rate is as described above, and may be further understood from FIG. 2B in which a plurality of the return ports 121-8-R are shown spaced along the head 106 (along length LU) and correspond to unit 114-8. The substantially uniform fluid inflow rate from the gap 110 into each of the plurality of return ports 121-8-R of the one unit 114-8-R is as described above with respect to the units 114 and the ports 121.

Referring again to FIG. 2A, the exemplary one of the flow conditioning units 114 was described above as the exemplary return unit 114-8-R. It was also noted above that, generally, the cross-sectional configuration of an outlet unit (e.g., 114-3-O) is similar to that shown for the return unit 114-8-R in FIG. 3A. Referring to FIG. 2A, the following description applies to exemplary outlet units 114 of the exemplary network 113. These outlet units are identified in FIG. 2A as the exemplary units 114-3-O, 114-5-O, 114-7-O, and 114-9-O. For this description of the outlet function, general reference numbers (without the "-#") are also used in reference to FIG. 2B.

Main bore 132 at the top of the unit 114 is a main outlet bore 132, and is configured to initially receive fluid under high pressure, such as an exemplary supply of water, to the outlet ports 121O (e.g., of unit 114-3). The exemplary fluid flows from the main outlet bore 132 and is divided and flows into the vertical flow bores 134 for flow to the resistor bore 142 in which the resistor 144 is received. As described below, the flow of the fluid through the resistor bore 142 is limited by the resistor 114 and as limited the fluid flows into the lower plenum 146 and then into the plurality of fluid transfer bores 148 and then into and through the plurality of fluid transfer (outlet) ports 121.

Figure 3B:
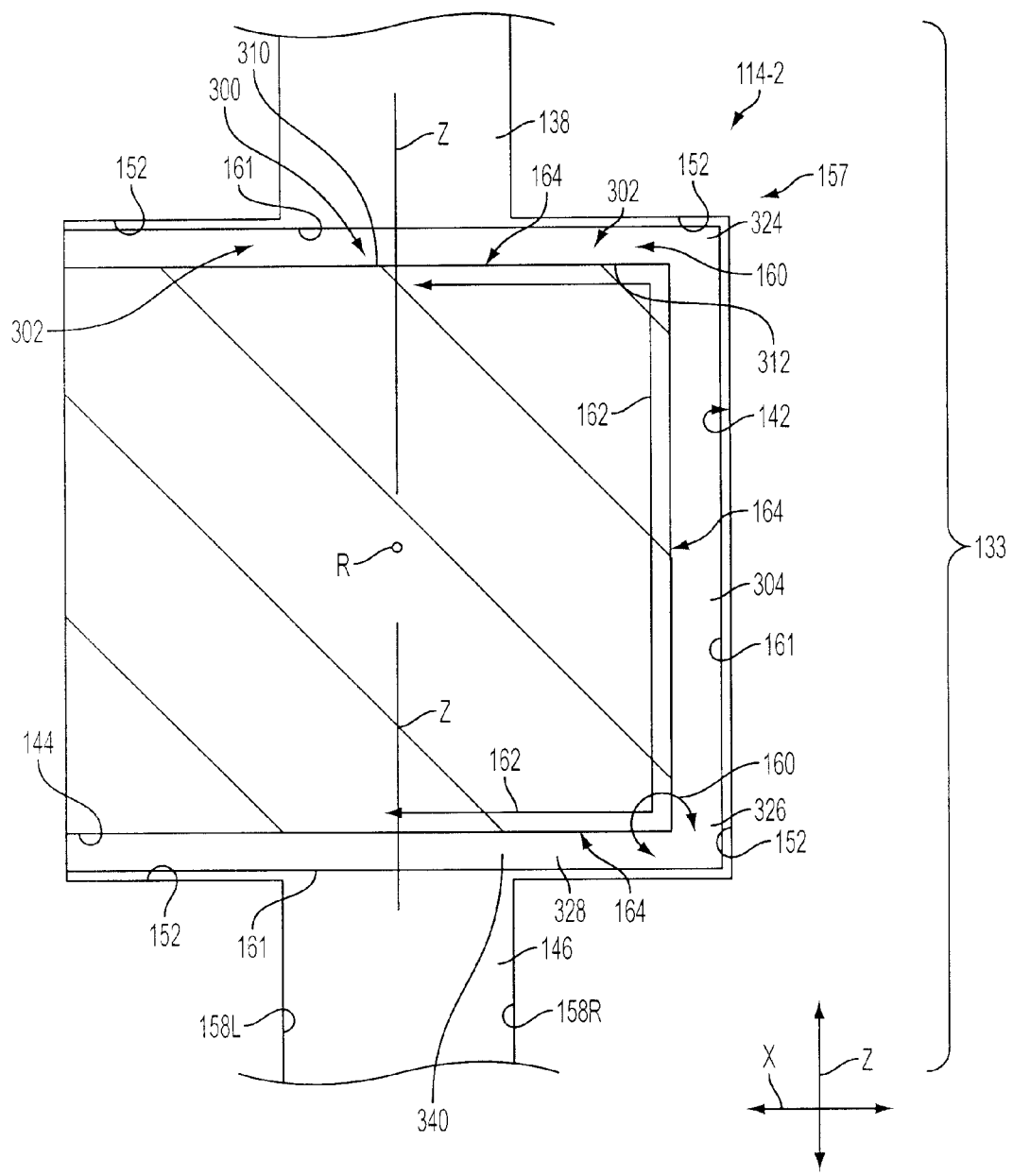
FIG. 3B is an enlarged view of one of the resistors shown in FIG. 3A, illustrating the resistor configuration of a return flow conditioning unit that cooperates with another unit at an end of the head.

The flow rates of the fluid through the outlet ports 121 of the exemplary unit 114 are substantially uniform as defined above, in which the substantial uniformity is relative to the ports 121S of one unit 114 all across the diameter of the wafer. With the above-described overview of the flow conditioning units 114, reference is made in more detail to FIG. 3A, and to FIG. 3B, that are described below in reference to fluid flow through all embodiments of the units 114. FIG. 3B is an enlarged view of unit return 114-2 shown in FIG. 3A. FIGS. 3A & 3B are described with respect to structure that is configured common to all of the units 114, thus the "-#" are not used in this description. The configuration of each of the respective upper and lower plenums 138 & 146 and of the resistor unit 133 is with a cross-section related to a same longitudinal axis (e.g., the Z axis). The resistor bore 142 is configured with walls 152. The upper plenum 138 and the lower plenum 146 and the resistor bore 142 are respectively configured so that in combination the respective cross-sections define a "cross-shaped cross-section", or "cross-shaped bore configuration", 157.

The cross-shaped resistor configuration is characterized by: (i) the plenums 138 and 146 being upright along the Z axis, (ii) the resistor bore 142 being between the plenums 138 and 146, and (iii) the resistor bore 142 extending transversely (parallel to the X axis) relative to the Z axis and transversely beyond the upright plenums 138 and 146. Thus, the resistor bore 142 extends to the left in FIG. 3B beyond one left vertical line 158L of the plenums 138 and 146. Similarly, the resistor bore 142 extends to the right in FIG. 3B beyond one right vertical line 158R of the plenums 138 and 146.

Generally, FIG. 3B illustrates the: (a) cross-shaped bore configuration 157, and (b) a cross-sectional resistor shape, or configuration, of the resistor 144 within the resistor bore 142 of the cross-shaped bore configuration 157 of exemplary return unit 114-2. Features (a) and (b) are common to all of the units 114. The exemplary resistor 144 shown in these Figures extends transversely relative to the upright plenums 138 and 146 and is separated by a transverse resistive flow space, or slit, 160 from walls 152 of the resistor bore 142. Ribs 161 (shown enlarged in FIG. 3B) extend from the resistor into contact with the walls 152. Ribs 161 center the resistor 144 in the bore 142 and thus maintain the transverse resistive flow space 160 at a selected value all around a longitudinal axis R of the resistor 144 (also referred to as 144-8). Axis R extends in the Y direction. Generally, the resistive flow space 160 is shown defining a tortuous flow path (see arrow 162 in FIG. 3B). The tortuous flow path 162 extends from the upper plenum transversely of the Z axis past line 158R and then in the Z direction and then transversely toward the Z axis into intersection with the lower plenum 146. Still referring generally to FIG. 3B, with the cross-shaped bore configuration 157, there is a configuration of the resistor 144 with a barrier surface 164 extending transversely, then parallel, then opposite transversely, all relative to the Z axis and conforming to the tortuous path (arrow 162).

Figure 4A:
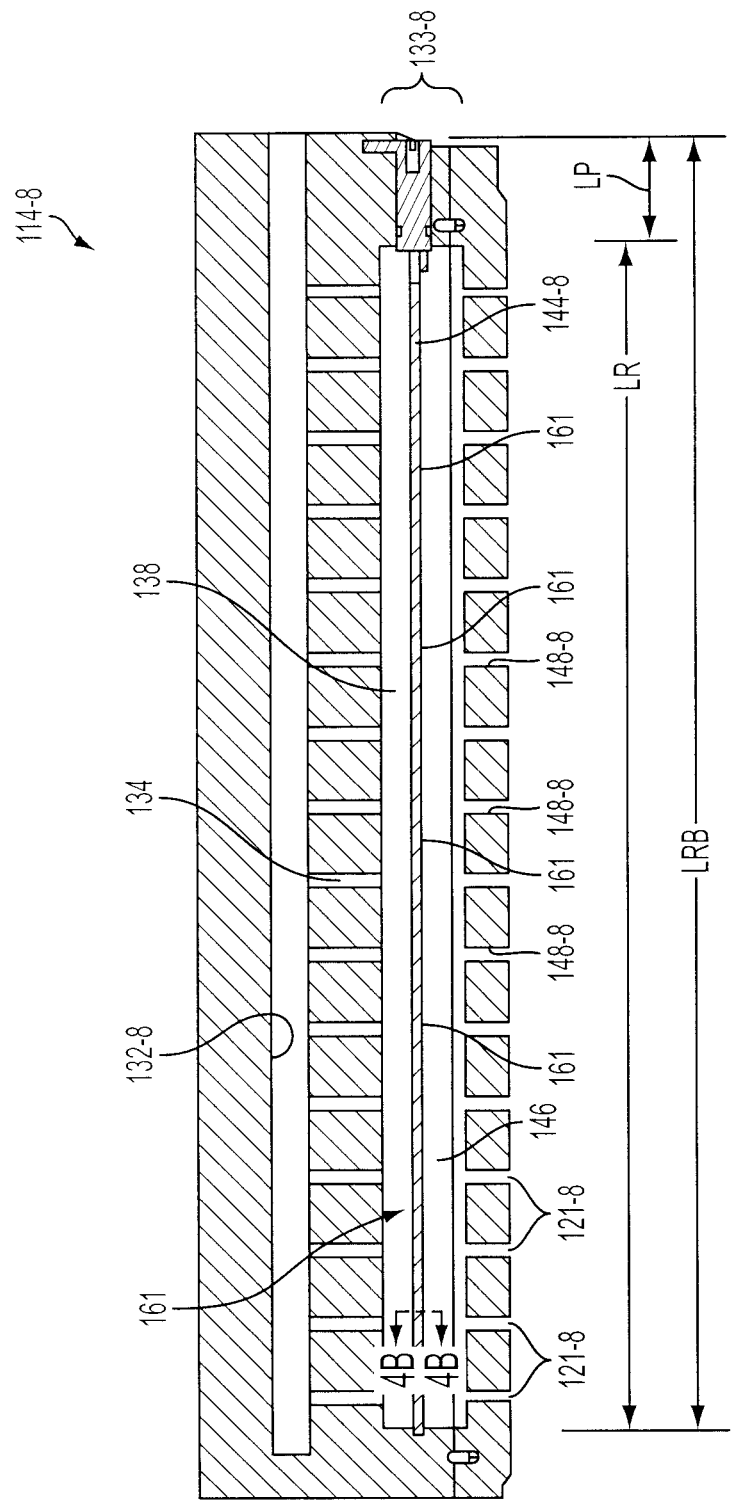
FIG. 4A is a cross-sectional view taken on line 4A-4A in FIG. 3A, showing an exemplary configuration of one return flow conditioning unit that may be partially surrounded by the unit shown in FIG. 3B.

Referring FIG. 4A (that is oriented oppositely to FIG. 2B), a general further description of the resistor 144 is as follows. The resistor bore 142 is shown extending from the blind end 142B to an open end at the face 124S1. The resistor 144 is inserted into the bore 142 until the resistor 144 touches the blind end 142B. FIG. 4A shows that a resistor length LR plus a length LP of a plug, or retainer, 166 equals a length LRB of the resistor bore 142. For proper functioning of a given resistor unit 133, only one plug 166 of a set of plugs and only one resistor 144 of a set of resistors of the network 113 are proper for that function. To be proper, not only must the combined lengths LP and LR equal the length LRB of the bore 142, but a tab 168 must fit into a slot 170 adjacent to the end of the bore 142.

With the length of the resistor 144 in mind, reference is made again to FIG. 3B, and to the: (a) cross-shaped bore configuration 157, and (b) cross-sectional shape of the resistor 144 within the resistor bore 142 of the configuration 157. It may be understood that features (a) and (b) of one flow conditioning unit 114 combine to provide a highest resistance to fluid flow of the flow structure that is between the main bore 132 and the ports 121. The highest resistance to fluid flow resulting from the features (a) and (b) is along the tortuous path 162, as described above, such that the initial flow in the Z direction from the main bore 132, or from the ports 121 and the lower plenum 146, is transformed into transverse flow away from the Z axis before returning to axial flow parallel to the Z axis. The highest resistance to fluid flow is thus applicable to both the outlet units (e.g., 114-3-O) and the return units (e.g., 114-8-R). For example, as a result of this highest resistance to fluid flow, the initial fluid flow in the main outlet bore 132 in the outlet units (e.g., in units 114-1, 114-3, 114-5, 114-7, & 114-9) is decoupled from the respective fluid flow in the lower plenum 146 and in the fluid transfer bores 148 of outlet unit 114-3. In the other return unit example, also as result of this highest resistance to fluid flow, the initial fluid flow in the fluid transfer bores 148 of the return units (e.g., units 114-2, 114-4, 114-6, 114-8, & 114-10) is decoupled from the respective fluid flow in the main bore 132. In each of the outlet and return units, this highest resistance and decoupling results even when the various bores 132 and 134, are configured according to relatively "low" tolerances, as defined above. In one embodiment, each of the + and − percentages may be about 1.149%, for example, such that the variation from nominal may be within a range of about 2.3%. Also, when a gun drill is used to configure the bores 132, for example, there may be a deviation of the center of the bore 132 from a most desired location of the center of the bore 132. Such deviation may occur as the bore 132 is drilled from the face 124S1 toward and to the blind end 124B of bore 132 (FIG. 2B). Such deviation may be referred to as "walkout" or "runout", and may be defined in terms of whether the actual center of the bore 132 is within or outside of a circle. Such circle has a walkout center that coincides with the most desired location of the center of the bore 132. The radius of the circle may be a percentage of the nominal diameter of the bore 132. In one embodiment the radius may be about 2.298%. As another example, the "low" tolerance for the diameter of the vertical bore 134 may be a + or a − percentage of the diameter of the bore 134. In one embodiment, each of these + and − percentages for the bore 134 may be about 2.5%, for example.

It may be understood that a usually disadvantageous result of the low tolerance is that the actual dimension of the respective bore (e.g., 132 or 134) may vary from nominal by the full amount of the percentage, e.g., by the full larger amount of the above-described difference. Also, for example, the flow rate of the fluid in those respective bores may vary widely. One unacceptable, high-cost way to overcome this usually disadvantageous result of the low tolerance is to configure all of the bores and plenums according to "high" tolerances, as defined above. In the embodiments, the configuration of the cross-shaped cross-section 157, in conjunction with the configuration of the fluid transfer bores 148, overcomes the usually disadvantageous result of those low tolerances. In detail, without using the costly high tolerances for all of the bores of each of the units 114, and by limiting use of high tolerances to the plenums 138 & 146 & to the resistor units 114 and bores 148, the units 114 achieve the desired substantially uniform fluid flow rates relative to the proximity head 106 even though those various bores 132 and 134 are configured according to the low tolerances, and even though the block 122 is a one-piece block.

As an example of limiting the use of high tolerances, _the "high" tolerance for the dimensions of the resistor bore 142 may only be a + percentage of the dimension of bore 142, with no − percentage. In embodiments of the bore 142 (e.g., as shown in FIG. 2A as 142-2 and 142-10), the − percentage may be zero (a zero tolerance), and the + percentage may be about 1.2%, for example. In another embodiment of the bore 142 (e.g., as shown in FIG. 2A as 142 in unit 114-3-O), there may be + and − percentages, with each being about 1.5%, for example.

In addition, the configuration of the resistors 144 for insertion into and removal from the resistor bore 142 enables substitution of one resistor for another after completion of the cross-shaped cross-section configuration 157 of the bore 152 in the block 122. Thus, no adjustment of the configuration of the completed block 122 need be made in order to achieve the desired substantially uniform fluid flow rates in each respective one of the various units 114. Rather, this substitution, coupled with ease of configuring only the one substituted resistor 144, may, e.g., provide the ribs 161 configured to conform to the actual size of the completed resistor bore 142. Such configuring of the resistors 144 is also facilitated by the suitability of even the more preferred materials PVDF and ECTFE (identified above) to be configured in the above-described cross-sectional shape of the resistor 144 for the above-described reception in the cross-shaped cross-sectional configuration 157 of resistor bore 142. Further, with the ribs 161 engaging the wall 152 of the resistor bore 142, the resistor 144 remains centered in the bore 142 even though there may be the above-described walkout. In one embodiment, with respect to the actual and desired center of the resistor bore 142, advantageously no tolerance is defined for the walkout of the resistor bore 142.

Additionally, it may be understood that one of the resistors 144 may be further configured to overcome the results of use of the relatively low tolerances. For example, the distance in the Y direction between the ribs 161 (e.g., see enlarged ribs 161 in FIGS. 4D, 5D,) may be selected, and be selected according to a cross-sectional dimension of the actual resistor bore 142. That cross sectional dimension may be used to determine cross-sectional dimensions of the resistor 144 between different pairs of the ribs 161, and thus select the value of the slit 160 between the resistor 144 and the bore 142 between those ribs 161. Also, within the one completed block 122 and for one unit 114, from the main bore 132 to the fluid transfer port 121, there is no seal (such as an O-ring) and no fastener is necessary to hold the one-piece block 122 together. Rather, the (i) plug 166 in the resistor bore 142, and (ii) the connection of a vacuum line or a fluid supply pipe (not shown) to the respective main bore 132, are the only openings into the block 122 that are sealed.

Other advantages and features of the resistors 144 may be appreciated by reference to the following descriptions of embodiments of the units 114. For example, referring again to FIG. 3A, five exemplary configurations of the units 114, including the resistor units 133, are shown. Each such exemplary configuration is characterized by the above-described features of the: (a) cross-shaped bore configuration 157, and (b) cross-sectional shape of the resistor 144 within the resistor bore 142 of the configuration 157.

FIG. 3A shows a first of the five exemplary configurations of the units 114, embodied in return units 114-4, 114-6, and 114-8 (also identified as 114-4-R, etc.). As an example of the first units 114, return unit 114-8 is shown in more detail in FIGS. 4A-4D. This description, and the description of FIG. 3B in respect to unit 114-8, are also applicable to units 114-4 and 114-6, with variations being the dimensions of the bore 142 and of the resistor 144. Referring to FIGS. 4A & 4B, the resistor unit 133-8 is configured with resistor 144-8 shown having the described length LR. The end to be inserted into the bore 142 bears indicia (a number, e.g., "5", see FIG. 4D in which the "5" is hidden) indicating that the resistors 144 of units 114-4, 114-6, and 114-8 are interchangeable (in that each bears indicia "5"). The cross section of FIG. 4B shows the ribs 161 extending around three sides of a rectangular cross-section of the resistor 144-8. The plan view of FIG. 4D shows an enlarged portion of the resistor 144-8, with the ribs 161 extending outwardly from one of the three sides of the resistor 144-8. One fourth side is shown in FIGS. 4B and 4D configured without the rib to allow that side to directly engage one (left, FIG. 4B) wall 152 of the bore 142. This configuration thus defines the slit (flow space) 160 and tortuous flow path 162 as shown in FIG. 3B including a section extending transversely as described above with respect to FIG. 3B. The end view of FIG. 4C illustrates the resistor 144-8 with a threaded end bore 172 to which a threaded tool (not shown) may be secured to facilitate insertion and withdrawal of the resistor 144 to and from the bore 142. A distal end tab 174 is shown for entry into a slot (not shown) at the left end of bore 142 to properly orient the resistor 144-8 in the bore 142.

Figure 5A:
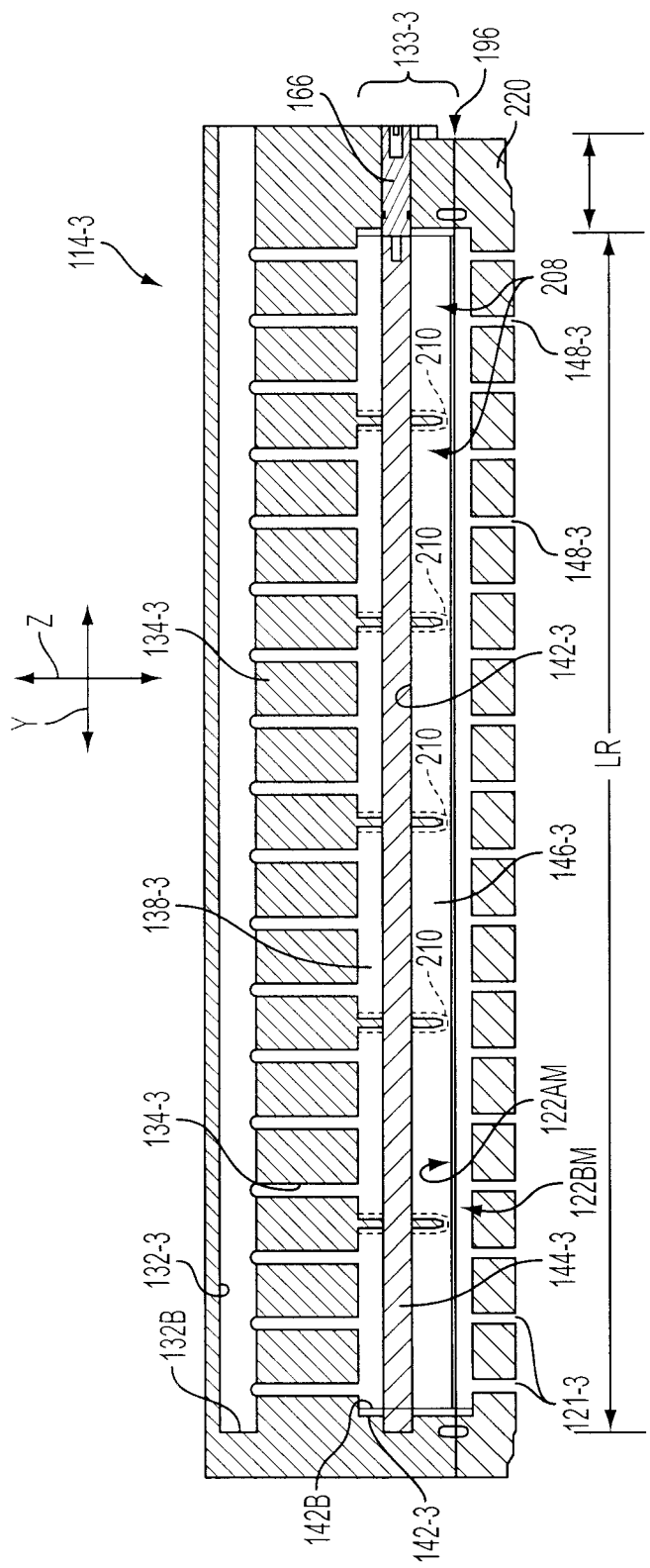
FIG. 5A is a cross-sectional view taken on line 5A-5A in FIG. 3A, showing an exemplary configuration of one supply flow conditioning unit.

A second of the five exemplary configurations of resistance unit 133 is shown with respect to FIG. 2A that shows outlet units 114-3, 114-5, 114-7, & 114-9. Also, the cross-sectional view of FIG. 3A shows these units, FIG. 5A shows an elevation view of one exemplary unit 114-3, and FIGS. 5B & 5D show the resistor 144-3 separately with the ribs 161. Views in FIGS. 5B and 5C show the cross-section of exemplary resistor 144-3. Referring to these Figures, the resistance unit 133-3 is configured with resistor 144-3 shown having the described length LR (FIG. 5A) that is unique to the outlets as described below. The end to be inserted into the bore 142-3 bears indicia (a number, e.g., "4") indicating that the resistors 144 of units 114-3, 114-5, 114-7 and 114-9 are interchangeable (in that each bears indicia "4"). The cross section of FIG. 5B, and FIG. 5D, show the ribs 161 extending around the circular perimeter of the resistor 144-3. This configuration with the ribs 161 thus defines the slit (flow space) 160 (shown in FIG. 3B), and with the circular cross-sections of resistor 144-3 and bore 142-3, the space 160 and tortuous flow path (see arrows 162 in FIG. 5B) extending transversely, both to the left and right of the unit axis R. Path 162 is within the circle of a rib 162 and outside the exterior of the resistor 144-3 between adjacent ones of the ribs 161. End view 5C illustrates resistor 144-3 with a threaded end bore 172 to which a threaded tool (not shown) is secured to facilitate insertion and withdrawal of the resistor 144-3 to and from the bore 142-3.

Figure 6A:
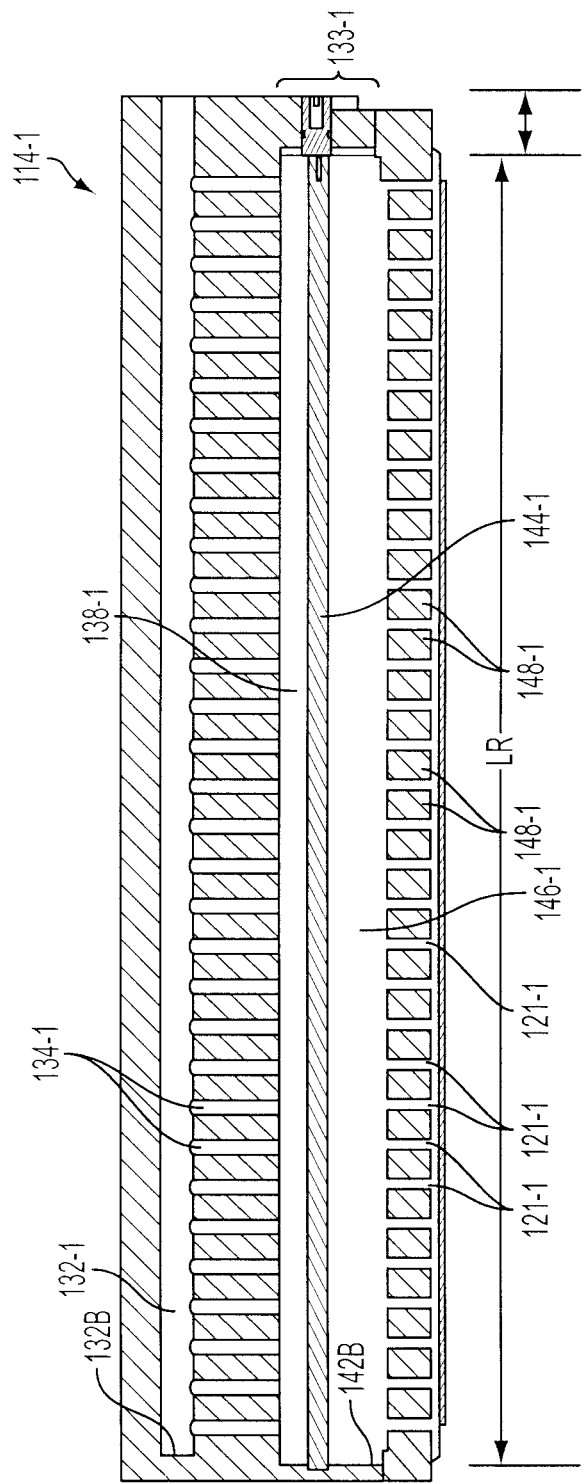
FIG. 6A is a cross-sectional view taken on line 6A-6A in FIG. 3A, showing an exemplary configuration of another embodiment of a supply flow conditioning unit.
Figure 6C:
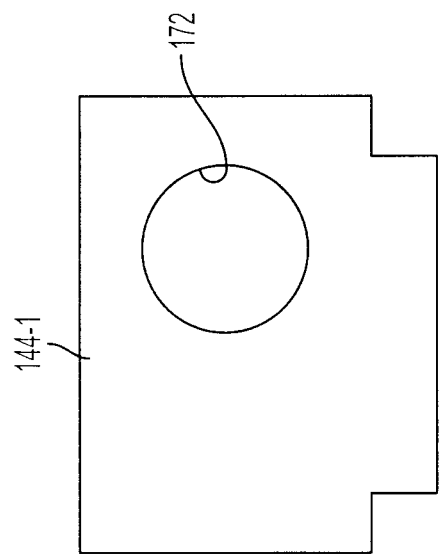
FIG. 6C is an end view of the exemplary configuration of the resistor of the supply flow conditioning unit of FIG. 6A.
Figure 6B:
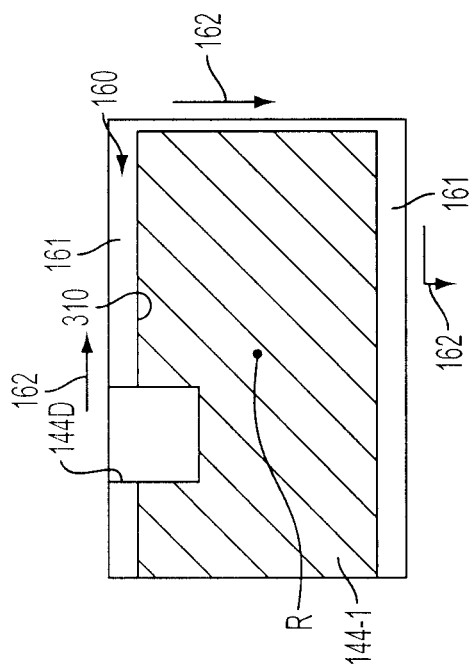
FIG. 6B is a cross-sectional view of the resistor of the unit shown in FIG. 6A, showing an exemplary rectangular configuration of the resistor of this supply unit with a recessed surface facing incoming fluid flow.

A third of the five exemplary configurations of resistance unit 133 is shown in FIG. 2A with respect to outlet unit 114-1 and resistance unit 133-1. FIG. 3A also shows resistor unit 133-1, and FIGS. 6A-6C show units 114-1 and 133-1 in detail. Referring to these Figures with respect to exemplary unit 114-1 and resistor unit 133-1, it may be understood that the resistance unit 133-1 is configured with resistor 144-1 having the described length LR, that is unique to the outlet unit 114-1. The end to be inserted into the bore 142-1 bears indicia (e.g., number "1") to distinguish resistor 144-1 of unit 114-1 from the resistors 144 of all other units 114. FIGS. 6B and 6C show the cross section of resistor 144-1, and FIG. 6B shows ribs 161 extending around three sides of the rectangular outside of the resistor 144-1. This configuration with the ribs 161 thus defines the slit (flow space) 160 (in the manner shown in FIG. 3B) extending transversely to the right of the unit axis R. The end view of FIG. 6C shows resistor 144-1 having a threaded end bore 172 to which a threaded tool (not shown) may be secured to facilitate insertion and withdrawal of the resistor 144-1 to and from the bore 142-1. The configuration of resistor 144-1 is for supplying N2/IPA to the wafer surfaces 104, and for initiating the transverse flow, a recess 144D is shown in the upper surface.

Figure 7A:
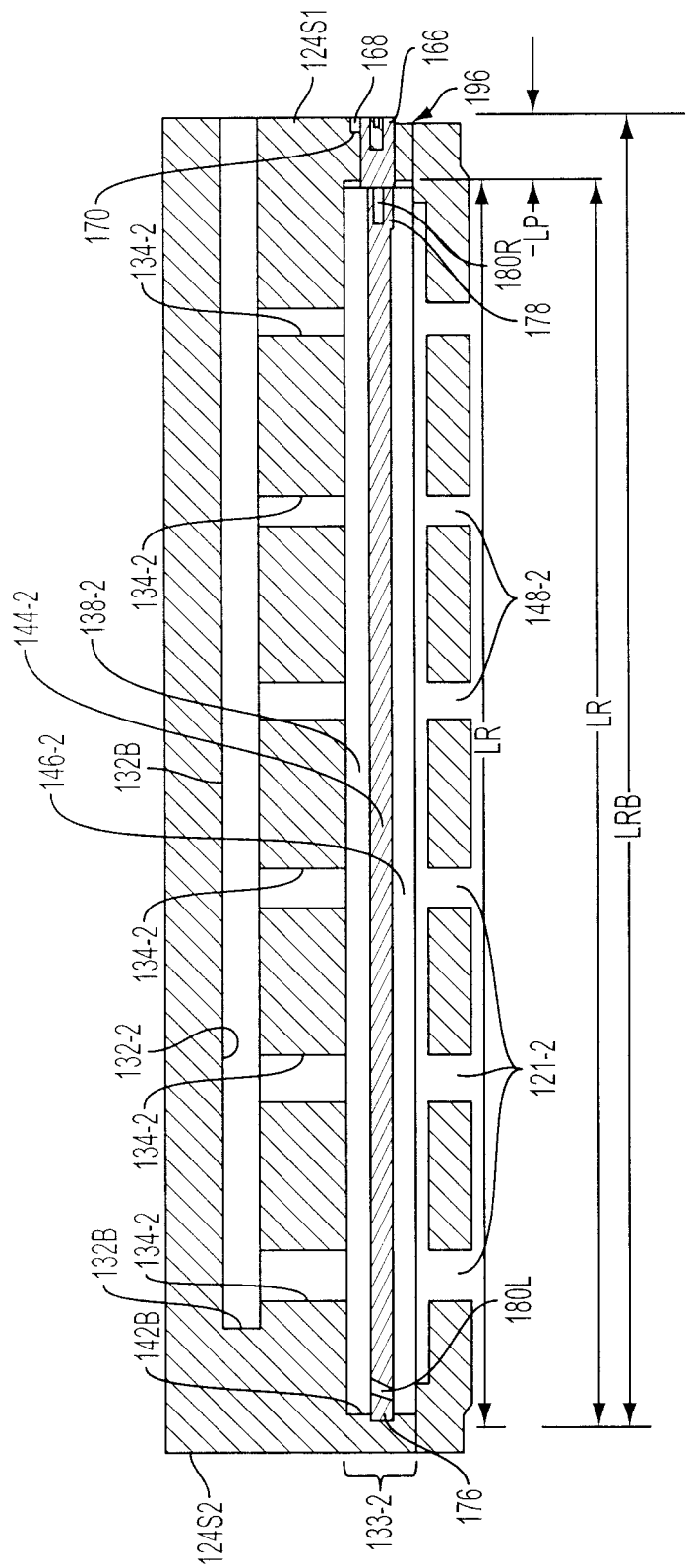
FIG. 7A is a cross-sectional view of the resistor of the return unit shown in FIG. 3A that cooperates with another unit at an end of the head, showing a by-pass bore that applies low pressure to the other unit via by-passing the resistive aspects of the resistor.

A fourth and fifth of the five exemplary configurations of resistance unit 133 are shown in FIG. 2A as respective units 114-2 and 114-10, that are return units 114-2-R & 114-10-R. Generally, each is similar to that shown in and described above with respect to FIG. 3A, except as follows. Recall that FIG. 1D was described in terms of the units 114-2 and 114-10 extending in a respective row 116 beyond the diameter D of the wafer 102 and beyond the units 114-3 through 114-9, and in terms of unit 114-2 joining units 114-11 and 114-12 that extend in the X direction in a column (see line 118). Unit 114-10 was also shown joining units 114-13 and 114-14. Unit 114-2 is one of the five exemplary configurations of resistance unit 133 in that resistor 144-2 is configured so as to cause fluid flow return from return units 114-11 and 114-12 into unit 114-2. Unit 114-10 is one of the five exemplary configurations of resistance unit 133 in that resistor 144-10 is configured so as to cause fluid flow return from return units 114-13 & 114-14. Units 114-2-R & 114-10-R are shown exemplified by unit 114-2-R in FIGS. 3A, 7A & 7B. The description of unit 114-2-R is also applicable to unit 114-10-R, with variations being related to the configuration of the resistors 144 for different directions of fluid flow, e.g., from the return units 114-11 and 114-12, and from the return units 114-13 & 114-14. Referring to FIG. 7A, the resistance unit 133-2 is configured with resistor 144-2 shown having the described length LR. FIG. 7A shows opposite ends 176 (at the left) and 178 (at the right). Between the ends 176 & 178 the resistor 144-2 is configured with the ribs 161 in the manner shown in FIG. 3B, and FIG. 4D (e.g., there for the resistor 144-8). In the manner shown in FIG. 3B, the body of the resistor 144-2 cooperates with the walls 152 of the bore 142-2 to define the flow space 160. The end 176 to be inserted into the bore 142-2 bears indicia (a number, e.g., "2" for resistor 144-10, and a number "3" for resistor 144-10) indicating that the resistor 144 of unit 114-2 is unique with respect to units 114-11 and 114-12, and that the resistor 144 of unit 114-10 is unique with respect to units 114-13 and 114-14.

Referring generally to FIG. 7A, each of the resistors 144-2 and 144-10 is configured at the respective ends 176 & 178 to apply low pressure to, and thus draw fluid flow from a respective two of the respective units 114-11 & 114-13 (from ends 178), and 114-12 & 114-14 (from ends 176). In more detail, the units 114-11 & 114-12 extend in the X direction one-half way across the head 106 between faces front face 124F and rear face 124R. These units cooperate with unit 114-2 that is adjacent to the rear face 124R, and thus cooperate with resistor 144-2. In FIG. 7A, ends 176 & 178 are illustrated showing each with an end return (or by-pass) bore 180, bore 180L being at the left end 176 and bore 180R being at the right end. In the view of FIG. 7A (that is reversed from the view of FIG. 1D), the end return bore 180L is shown flaring outwardly toward face 124S2. Referring to FIG. 1D, the end return bore 180L also flares in the X direction toward the front face 124F in view of the extension of the unit 114-11 toward the front face. Also, in FIG. 7A the end return bore 180R flares outwardly toward opposite face 124S1, & also flares in the X direction toward the front face 124F in view of the extension of the unit 114-11 toward the front face 124F.

In a similar manner but adjacent to front face 124F, unit 114-10 cooperates with the units 114-13 & 114-14 that extend in the X direction one-half way across the head 106 between front face 124F and rear face 124R. These units cooperate with resistor 144-10. Based on FIG. 7A, it may be understood that the end return bore 180L of unit 114-10 also flares in the X direction toward the rear face 124R in view of the extension of the unit 114-14 toward the rear face. It may also be understood that the end return bore 180R of unit 114-10 flares outwardly toward opposite face 124S1, & also flares in the X direction toward the rear face 124R in view of the extension of the unit 114-13 toward the rear face 124R.

The cooperation of the unit 114-2 with units 114-11 & 114-12, and the cooperation of units 114-10 with units 114-13

& 114-14, may be further understood by reference to FIG. 1D. There, for example, the ports 121 in the row 116 of unit 114-2 (that extend in the Y direction) are shown joining the ports 121 in the columns 118 of units 114-11 & 114-12 (that extend in the X direction). The joining is at curved corner 130. The application of low return pressure to the ports 121 of units 114-11 & 114-12 is facilitated by the resistor 144-2 (FIG. 7A) configured with the end return bores 180L & 180R that flare as described above. Also, the ports 121 in the row 116 of unit 114-10 (that extend in the Y direction) are shown joining the ports 121 in the columns 118 of units 114-13 & 114-14 (that extend in the X direction). The joining is at curved corner 130. The application of low return pressure to the ports 121 of units 114-13 & 114-14 is facilitated by the resistor 144-10 configured with the end return bores 180L and 180R as described above.

Figure 7B:
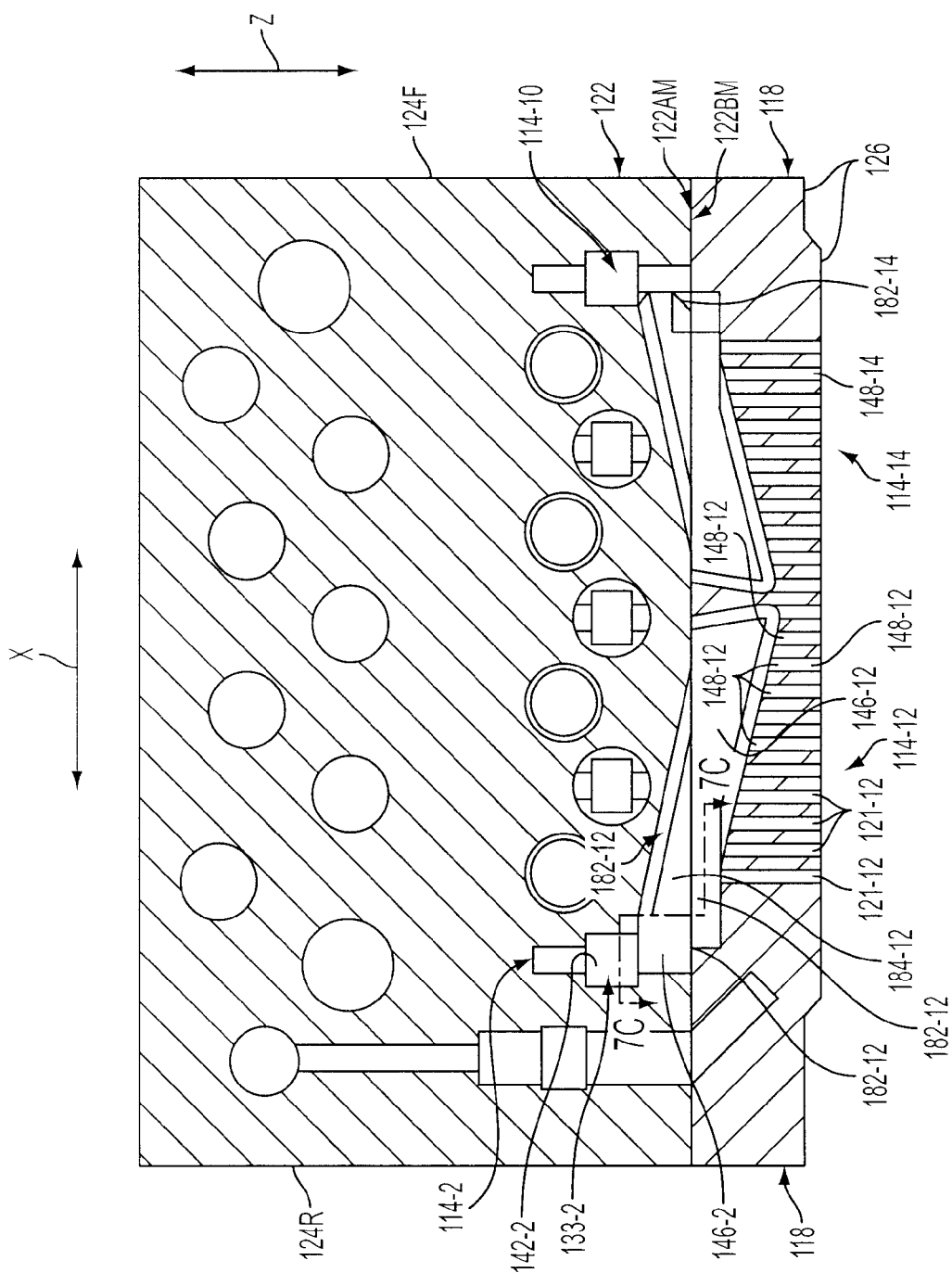
FIG. 7B is a cross-sectional view of the proximity head, illustrating the return unit shown in FIG. 7A and the other unit at the end of the head, showing a configuration of the end unit to promote uniformity of low pressure applied to ports of the other unit.

Referring to FIG. 1D, the section line for FIG. 7B extends along exemplary units 114-14 and 114-12 near the face 124S2. A section line extending along exemplary units 114-13 and 114-11 near the face 124S2 would show similar structure. Reference is made to FIGS. 7B & 7C for a description applicable to both structures of units 114-2 and 114-10. Resistor unit 133-2 is shown in FIG. 7B with resistor bore 142-2 connected to lower plenum 146-2. The resistor 144-2 is not shown. The section of FIG. 7C is taken through unit 114-2, & also shows unit 114-12. The resistor bore 142-2 ends and does not join the unit 114-12. Also, the upper plenum 138-2 ends and does not join unit 114-12. The resistor 144-2 is also shown ending adjacent to the end of the resistor bore 142-2. The lower plenum 146-2 is shown merging with a curved return feed passage 182-12 of unit 114-12. The curved return feed passage 182-12 curves around the curved corner 130 and merges with a straight return passage 184-12 that extends in the X direction. FIG. 7B shows the passage 184-12 extending, or sloping, diagonally downwardly as it extends away from the corner 130. Recall that the lower plenum 146-2 has the low pressure applied to it by the resistor unit 144-2 after the above-described highest resistance has been imposed on the fluid flow to the main bore 132-2, and that only at the ends 176 and 178 has the low pressure been applied to the lower plenum 146-2 directly via the by-pass bores 180L and 180R. As a result of: (a) the lower plenum 146-2 being in open communication with the exemplary straight return passage 184-12 (via the curved return passage 182-12; and (b) this action of the by-pass bore 180L, the fluid flow rates in the fluid transfer bores 148-12 tend to be balanced with the fluid flow rates in the fluid transfer bores 148-2. In FIG. 7B, passage 184-12 is shown above the row 118 of the fluid transfer bores 148-12 of the unit 114-12, and is thus above the ports 121-12 that are at the ends of those bores 148-12. In FIG. 7B the column 118 of fluid transfer bores 148-12 of unit 114-12 is shown open to the straight return passage 184-12.

In review, it may be appreciated that the configuration of the end 176 of the resistor 144-2 (with the end return bore 180L) is different from the above-described tortuous flow path 162, and the by-pass bore 180L flares toward the face 124S2. As a result, the end return bore 180L that extends through the end 176 of the resistor 144-2 by-passes the tortuous flow path 162 that extends to the lower plenum 146-2 of the unit 114-2, and applies the low pressure to the bores 148-12 of unit 114-12. With this by-pass effect, the bore 180L does not provide the high resistance to fluid flow of the flow structure that is between the main bore 132-2 and the ports 121-12 of the unit 114-12. Rather, the low pressure applied by the upper plenum 138 to the resistor bore 142-2 is allowed to be applied through the end return bore 180L to the curved return feed passage 182-12 that curves around the curved corner 130 and merges with the straight return passage 184-12. Passage 184-12 in turn applies the low pressure to the tops of the bores 148-12. To offset the loss of the highest resistance, because of the slope of the passages 182-12 and 184-12, the length in the Z direction of the fluid transfer bores 148-12 is greatest close to the end return bore 180L, and decreases with increased distance in the X direction from the bore 180L toward the unit 114-12. This varying length of the bores 148-12 tends to equalize the low pressure applied by the bores 148-12 to the ports 121-12. Because of the combined resistance to flow in the end return bore 180L and in the fluid transfer bores 148-12, the fluid flow rates into the ports 121-12 have an acceptable degree of uniformity, but less uniformity than the substantially uniform fluid flow rate into the fluid transfer ports 121-2 along the row 116.

The foregoing description of the cooperation of the unit 114-2 with unit 114-12 is also applicable to the cooperation of the unit 114-2 with unit 114-11, and to the cooperation of unit 114-10 with units 114-13 & 114-14. Thus, the varying Z direction lengths of the bores 148-11, 148-13, and 148-14 tend to equalize the low pressure applied by the respective bores to the respective ports 121-11, 121-13, and 121-14, and because of the combined resistance to flow in the respective end return bores 180L and 180R, and in the respective fluid transfer bores 148, the fluid flow rate into the respective ports 121 of columns 118 has an acceptable uniformity approaching the substantial uniformity with respect to the fluid flow rate into the fluid transfer ports 121 along the rows 116.

Ease of configuring the one-piece proximity head 106 may be understood by reference to FIGS. 1C & 3A. Initially, the configuring may be understood by reference to the above-identified U.S. Provisional Patent Application No. 61/008,856, filed on Dec. 20, 2007, and entitled "Methods Of Configuring A Proximity Head That Provides Uniform Fluid Flow Relative To A Wafer", that has been incorporated by reference. An understanding of such methods of configuring may be had by reference to FIG. 1C that shows the one-piece block 122 with a fused region 196 (identified by rows "xxxx . . ."), shown including sections 196-1 and 196-2, each extending in the X direction and intersecting the lower plenum 146-2 of the depicted unit 114-2. The sections 196-1 and 196-2 initially extend along mating surfaces 122AM and 122BM of separate parts 122A and 122B of the block 122. Surfaces 122AM & 122BM are identified by a line 122AM/122BM in FIGS. 1C & 3A. Line 122AM identifies the mating surface of part 122A. Line 122BM identifies the mating surface of part 122B. It is to be understood that those surfaces 122AM and 122BM become fused as the fused region 196 is formed (or configured) as described below. In more detail, those parts 122A and 122B are joined by fusing the surfaces 122AM and 122BM of sections 196-1 and 196-2 to form the integral, one-piece block 122 configured with the fused region 196. FIG. 3A shows the block 122 configured with the two parts 122A and 122B, and for clarity of illustration a line 196 identifies the fused region 196. To facilitate configuring the units 114 in the block 122, the parts 122A and 122B are initially separate, are configured with the above-described respective portions of the units 114 while separate, and are then joined (fused) to define the one block 122 as a one-piece block configured with the fused region 196. First section 122A extends along the length LH (FIG. 1B) of the proximity head 106, and is configured with the face 124S1 extending perpendicular to the length LH of the head 106 (in the X and Z directions). The inner mating surface 122AM is a first mating surface extending perpendicular to the face 124S1 and to the opposite face 124S2. First mating surface 122AM is a plane defining the separation of the sections 122A and 122B, prior to the joining by the fusing. Referring generally to the units 114, the first section 122A is shown in FIG. 3A configured with the main inlet bore 132. A bore is shown in FIG. 7A for a plug 166 that leads to the resistor bore 142 (FIG. 1C). Bores 132 and the plug bore extend through the first end 124S1. FIG. 3A shows the part 122A also configured with upper plenum 138, and with a portion 200 of the lower plenum 146 extending from the first mating surface 122AM. With this configuration of the first block section 122A, access to the inside of the first part 122A may be had through the first mating surface 122AM for machining. For example, for units 114-1, 114-2, 114-4, 114-6, 114-8 and 114-10, machining by a router may configure the upper plenum 138, the portion 200 of the lower plenum 146, and the resistor bore 142, all extending in the Y direction. Through the portion 200 and through the resistor bore 142 and through the upper plenum 138, access may then be had to define (e.g., drill) the vertical flow bores 134 into intersection with the main inlet bore 132. Also, for the units 114-2 and 114-10, the above-described passages 182 and 184 shown in FIG. 7B may be machined through the mating surface 122AM.

To complete configuration of the first section 122A, units 114-3, 114-5, 114-7, and 114-9 may be configured. Initially, a gun drill may be used to enter the block 122A via the face 124S1 and configure the resistor bores 142. The bores 142 are configured as shown in FIG. 5A to the blind end 142B. Referring to FIG. 5A, and considering the exemplary resistor 144-3 removed from the bore 142, the configuration of the exemplary resistor unit 133-3 may be understood. The upper plenum 138-3 is shown above the resistor bore 142-3, and the lower plenum 146-3 is shown below the bore 142-3. Each plenum 138 & 146 is shown in sections 208 spaced by a bridge 210. To configure the separate sections, a tool (not shown) may be extended through the mating surface 122AM and through the resistor bore 142-3 to a suitable depth (at the intended top of the upper plenum 138-3). The tool is moved in the Y direction just short of a desired location of a next bridge 210. The tool is withdrawn through the mating surface 122AM, and is indexed by an amount of the Y direction thickness of the bridge 210. The tool is again used to configure a next section 208, and other sections 208. Upon configuring the bore for the plug 166, that may have a diameter larger than that of the resistor bore 142, the configuring of one part of one unit 114 (the part in the part 122A) is complete. It may be understood that the configuration of the various units 114 spaces the units as shown in FIG. 2A, for example.

It may be understood that ease of manufacture of the block 122 may also be by configuring the second part 122B, that extends along the length LH of the proximity head 106. The second part 122B is configured with the second mating surface 122BM. The second part 122B is further configured with the plurality of flat surfaces 126 parallel to the second mating surface 122BM. FIGS. 2A, 3A, and 5A show the second part 122B configured with a lower portion 220 of the lower plenum 146 extending to the second mating surface 122BM. This portion of each unit 114 may be configured by a tool (not shown) via the second mating surface 122BM, the tool being moved in the Y direction. The second part 122B is further configured with the plurality of ports 148 extending from the lower portion 220 through one of the flat surfaces 126.

In FIGS. 2A, 3A, 5A, and 7A the first part 122A and the second part 122B are shown joined at the fused region 196 to hold the first and second mating surfaces 122AM and 122BM (FIG. 3A) together. The joining is with the portions 200 & 220 of the lower plenum 146 aligned to define the entire lower plenum 146. Also, as joined, the faces 124S1 of parts 122A & 122B combine and are shown in FIG. 1A identified as the face 124S1, for example. In the same manner the opposite face 124S2 is formed and identified in FIG. 1A. It may be understood that each of the first and second parts 122A and 122B is configured from a single piece of the above-described material. When joined, as by fusion, the block 122 is as described above, configured to extend in the Y direction over the path of the wafers 102 for performing the meniscus processing. The one-piece block 122 may be further processed to seal the resistor bore 142 at the first end 124S1, such as by an O-ring used with the plug 166.

Figure 8A:
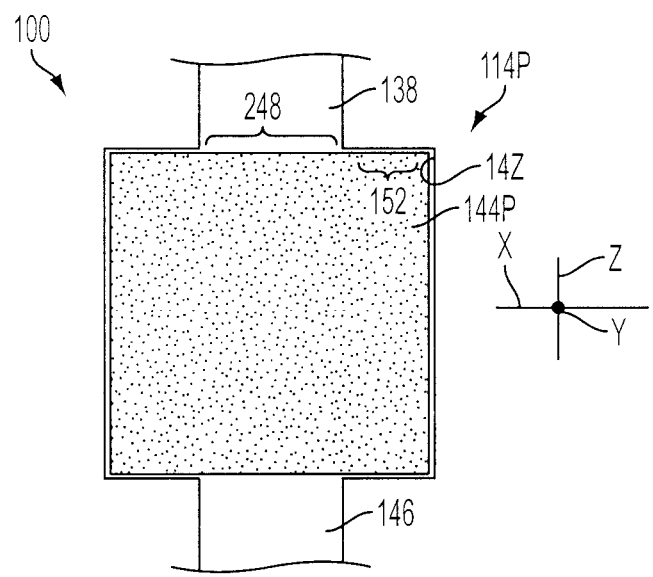
FIG. 8A is an enlarged view of another embodiment of a resistor, illustrating a cross-section of an open cell porous material.
Figure 8B:
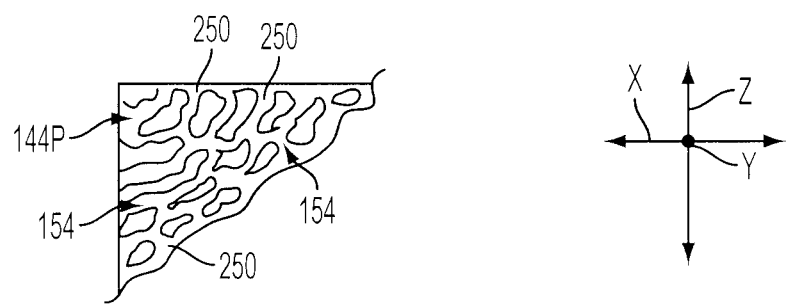
FIG. 8B is an enlarged view of a portion of the open cell porous material of FIG. 8A, illustrating the material defining tortuous flow paths.

Another embodiment of one unit 114 that may represent a common configuration of all of the units is shown as 114P in FIG. 8A. The resistor is identified as 144P and is configured with a shape that fills the resistor bore 142. The configuration of the resistor bore 142 that receives the resistor 144P may comprise a central section 248 (aligned with the upper plenum 138) and the resistor bore 142 (offset transversely from the upper plenum 138). The resistor 144P is configured from open cell porous material. FIG. 8B is an end view of a small portion of the porous material. FIG. 8B illustrates interstices 250 through which the limited flow of fluid flows from the upper plenum 138 to the lower plenum 146. The resistor 144P, configured with the open cell porous material received in the resistor bore 142, thus provides a plurality of the tortuous paths 154 comprising paths extending in the width (X) direction and in the Z direction. The porous material may be self-supporting, and be a bead pack made by PVDF, with a pore size of about 500 microns. The interstices 250 of the open cell porous material define the many tortuous flow paths 154 such that the resistor 144P has a shape so as to limit flow of the fluid through the resistor bore 142 to the lower plenum 146. With the lower plenum 146 and the fluid transfer bores 148 configured in a manner similar to that described above, in operation the fluid flowing through the upper plenum 138, the resistor bore 142 (with the resistor 144P) and the lower plenum 146 may be substantially conditioned (as defined above) to define the above-described substantially uniform fluid outflow from the plurality of fluid transfer bores 148 into the gap 110.

In review, the proximity head 106 may be described as being configured for defining a main fluid flow and separate flows of fluid. Such configuration may be provided by one or more of the above-described units 114. Generally, the units 114 may be selected according to the function that the unit is to serve in the head 106. For example, in one embodiment by the unit 114-2 the main flow of fluid may be a vacuum to define an outer return, whereas by the unit 114-3 the main fluid flow may be a supply or delivery of a chemical suited to clean the wafer surface 104. Other examples include a main flow by unit 114-2 that may apply a vacuum to define another return, and a main flow by a unit 114-3 that may supply or deliver DIW suited to provide a source to further clean the wafer surface 104. Also, in the embodiment shown in FIG. 1B another unit 114-1 may supply or deliver a main flow of N2 or IPA to perform a final cleaning of the wafer surface 104 as the wafer 102 passes the head 106. In each such unit 114, the main flow is separated into separate flows that are relative to the plurality of flat surfaces 126 to define the meniscus 108 extending to the surface 104 of the wafer 102 so that the separate flow rates are substantially uniform (as defined above) in the unit 114 across the length LH of the head 106. As described, the plurality of flat surfaces 126 are configured for placement in the above-described substantially parallel orientation with respect to the surface 104 of the wafer 102.

It may also be understood that the separation of the main flow into separate flows relative to the meniscus 108 is "direct", which is described as follows. First, for the supply units, e.g., units 114-1, 114-3, 114-5, 114-7, & 115-9, and considering one exemplary unit 114-3, the main fluid transfer bore 132-3 and the vertical fluid flow bores 134-3 separate the main flow (in the bore 132-3) directly into a first total number of flow separate paths that are between the main bore 132-3 and the upper plenum 138-3. In other words, between bore 132-3 and plenum 138-3, there is no further separation of flow into more flow paths. Similarly, for the return units, e.g. including units 114-2 & 114-10, and considering one exemplary unit 114-2, the vertical fluid flow bores 134-2 separate the main flow from the resistor unit 133-2 directly into a second total number of flow separate paths that are between the main bore 132-2 and the upper plenum 138-2. In other words, between the bore 132-2 and plenum 138-2, there is no further separation of flow into more flow paths.

Also, on the other side of the exemplary resistor unit 133-3 (i.e., adjacent to the lower plenum 146-3), there may be a third total_number of separate flow paths configured between the lower plenum 146-3 and the ports 121-3. In other words, between the lower plenum 146-3 and the ports 121-3, there is no further separation of flow into more flow paths. Additionally, on the other side of the exemplary resistor unit 133-2 (i.e., adjacent to the lower plenum 146-2), there may be a fourth total number of separate flow paths configured between the lower plenum 146-2 and the ports 121-2. In other words, between the lower plenum 146-2 and the ports 121-2, there is no further separation of flow into more flow paths.

The first and third totals numbers may be described in terms of an exemplary ratio, in which the third total number divided by the first total number may be less than ten, and in one embodiment may be about eight, for example. In one embodiment, the first total number may be about twelve the third total number may be about ninety-eight. The second and fourth total numbers may also be described in terms of an exemplary ratio, in which the second total number divided by the fourth total number may be between ten and twenty, and in one embodiment may be about sixteen, for example. In one embodiment, the second total number may be about six and the fourth total number may be about one-hundred. It may be understood that the second and fourth total numbers may be specified by the recipe for the meniscus processing, and the ratio used to determine the respective first and third total numbers. In review, the higher ratio requires fewer bores 134, and from the standpoint of reducing the number of machining operations performed on part 122A, for example, is preferred.

Additionally, these first and second total numbers of flow paths that are provided "directly" (i.e., in the above-described manner) are provided without using the high tolerances for all of the bores of the units 114. As described, all of bores 132 and 134 are configured according to the low tolerances. Also as described, the configuration of the units 114 limits use of high tolerances to the plenums 138 & 146, & to the resistor units 114 and the bores 148. Configuration of the units 114 in this manner limiting the use of high tolerances still achieves the desired substantially uniform fluid flow rates in the bores 148 of one unit 114 relative to the proximity head 106 even though those various bores 132 and 134 of the one unit 114 are configured according to the low tolerances, and even though each such exemplary one unit 114 is provided in the one-piece block 122 that has only the one fused region 196.

In more review, the apparatus 100 has been described for conditioning fluid flowing relative to the surface 124B of the proximity head 106 in meniscus processing of the wafer surface 104. The apparatus is configured from the one-piece block 122, that is configured with the length LH extending across the entire extent of the wafer surface (e.g., diameter D).

For a unit 114, the block 122 may include the main fluid transfer bore 132 configured generally parallel to the head surface 124B across the block length (e.g., beyond diameter D). For the unit 114, the block 122 may also include the resistor unit 133 extending across the block length and configured between the main bore 132 and the head surface 124B to impose a resistance on the fluid flowing relative to the head surface 124B (e.g., into or out of ports 121) between the main bore 132 and the head surface 124B. For the unit 114, the block 122 may also include the plurality of bores 134 and the plurality of bores 148. Such bores 134 and 146 may be referred to as a plurality of arrays of fluid transfer units. Each such array may extend only in the fluid transfer direction of the Z axis, as shown in FIG. 2A, for example. These plurality of arrays consist of (i.e., only include) a first set of fluid transfer bores and a second set of fluid transfer bores. The first set is represented by the bores 134, and the second set is represented by the bores 148. Bore 134 (the first set) are open to and between the main bore 132 and the resistor unit 133. Bores 148 (the second set) are open to and between the resistor unit 133 and the head surface 124B so that the resistor unit 133 of unit 114 substantially conditions the fluid flowing relative to the head surface 124B and flowing between the main bore 132 and the head surface 124B and all across the wafer surface (i.e., across the entire diameter D).

Further aspects of an embodiment of the apparatus 100 include the main bore 132 and the resistor unit 133 and the arrays (bores 134 & 148) configured to cause the fluid flow relative to the head surface 124B to be into the second set of fluid transfer bores (i.e., into bores 148 through the ports 121 of the unit 114) and through the resistor unit 133 and into the main bore 132. The embodiments of the units 114-3 and 114-5 exemplify such flow, for example. Also, the resistance imposed by the resistor unit 133 is a "highest" resistance, and "highest" may be relative to other resistances imposed by the first and seconds sets of bores (134 & 148) on the fluid flowing in the respective first and seconds sets of bores, the other resistances being less than the highest resistance imposed by the resistor unit.

In addition, in one embodiment the main bore 132 and the resistor unit 133 and the arrays (bores 134 & 148) are configured to cause the fluid flow relative to the head surface 124B to be from the main bore 132 into the first set (bores 134) and through the resistor unit 133 and through the second set (bores 148) past the head surface 124B to the wafer 102. The first and second sets of bores impose other resistances on the fluid flowing in the respective first and seconds sets of bores, the other resistances being less than the resistance imposed by the resistor unit.

Also in review, in one embodiment the total number of bores 134 of the first set consists of fewer bores 134 than the total number of bores 148 of the second set. In addition, in one embodiment each of the main bore 132 and the bores 134 of the first set is configured according to the low tolerances.

In still further review, the apparatus 100 is described including structure (e.g., resistor unit 133) for conditioning fluid flow introduced into the proximity head 106 for delivery to the surface 104 of the wafer 102. The proximity head 106 has the head surface 124B with the plurality of flat surfaces 126. The plurality of flat surfaces 126 are configured for placement in the substantially parallel orientation with the surface 104 of the wafer 102 (FIG. 1A). The apparatus 100 has been described as configured with units 114, each configured with the main inlet bore 132 configured (as by 132-3) to initially receive a fluid to be provided to the proximity head 106. The main inlet bore 132 extends along the length LH of the proximity head 106 for a distance comparable to LR (e.g., FIG. 5A). The units 114 also include the plurality of vertical, or down, flow bores 134 having first ends 136 (FIG. 2B) connected to the main inlet bore 132, the plurality of bores 134 being spaced apart from each other along the length of the proximity head 106. The units 114 also include the upper plenum 138 connected to second ends 140 of the plurality of down flow bores 134. Each down flow bore provides a feed of the fluid into the upper plenum 138, and the upper plenum 138 extends along the length LH of the proximity head 106. Units 114 include the resistor bore 142 extending along the length LH of the proximity head 106 and connected to the upper plenum 138. The resistor bore 142 is configured (e.g., with shape 157, FIG. 3B) to receive the resistor 144 that has the exemplary shapes defined with respect to FIGS. 3B, 4B, 5B, & 6B, so as to limit flow of the fluid through the resistor bore 142. Units 114 also include lower plenum 146 extending along the length LH of the proximity head 106 and connected to the resistor bore 142. The lower plenum 146 is configured to receive fluid from the resistor bore 142 as limited by the resistor 144. The units 114 are configured with the plurality of outlet ports 121 defined along the length LH of the proximity head 106 and extending between the lower plenum 146 and the flat surfaces 126 of the head surface 124B. Fluid flowing in each separate unit 114 through the upper plenum 138, the resistor bore 142 (with the resistor 144) and the lower plenum 146 is substantially conditioned to define a substantially uniform fluid outflow from the plurality of outlet ports of that exemplary unit. For example, such outflow is the above-described value of Equation 1 indicating that the flow rate of such fluid flowing through each such port 121 of one of the units (e.g., 114-3) is substantially uniform relative to the flow rates of fluid flowing in all of the other ports 121 of the exemplary unit 114-3.

In further review, the apparatus 100 is described including structure (e.g., resistor unit 133) for conditioning fluid flow introduced into the proximity head 106 for delivery to the surface 104 of the wafer 102. The proximity head 106 has the head surface 124B with the plurality of flat surfaces 126. The plurality of flat surfaces 126 are configured for placement in the substantially parallel orientation with the surface 104 of the wafer 102 (FIG. 1A). The apparatus 100 has been described as configured with units 114, each configured with the main inlet bore 132 configured (as by 132-3) to initially receive a fluid to be provided to the proximity head 106. The main inlet bore 132 extends along the length LH of the proximity head 106 for a distance comparable to LR (e.g., FIG. 5A). The units 114 also include the plurality of vertical, or down, flow bores 134 having first ends 136 (FIG. 2B) connected to the main inlet bore 132, the plurality of down flow bores 134 being spaced apart from each other along the length of the proximity head 106. The units 114 also include the upper plenum 138 connected to second ends 140 of the plurality of down flow bores 134. Each down flow bore provides a feed of the fluid into the upper plenum 138, and the upper plenum 138 extends along the length LH of the proximity head 106. Units 114 include the resistor bore 142 extending along the length LH of the proximity head 106 and connected to the upper plenum 138. The resistor bore 142 is configured (e.g., with shape 157, FIG. 3B) to receive the resistor 144 that has the exemplary shapes defined with respect to FIGS. 3B, 4B, 5B, & 6B, to receive the resistor 144 so as to limit flow of the fluid through the resistor bore 142. Units 114 also include lower plenum 146 extending along the length LH of the proximity head 106 and connected to the resistor bore 142. The lower plenum 146 is configured to receive fluid from the resistor bore 142 as limited by the resistor 144. The units 114 are configured with the plurality of outlet ports 121 defined along the length LH of the proximity head 106 and extending between the lower plenum 146 and the flat surfaces 126 of the head surface 124B. Fluid flowing in each separate unit 114 through the upper plenum 138, the resistor bore 142 (with the resistor 144) and the lower plenum 146 is substantially conditioned to define a substantially uniform fluid outflow from the plurality of outlet ports of that unit. For example, such outflow is the above-described value of Equation 1 indicating that the flow rate of such fluid flowing through each such port 121 of one of the units (e.g., 114-3) is substantially uniform relative to the flow rates of fluid flowing in all of the other ports 121 of the exemplary unit 114-3.

In added review, the apparatus 100 also includes the configuration of the resistor bore 142 (FIG. 3B) with a central section 300 aligned with the upper plenum 138 and with transverse sections 302 offset transversely from the upper plenum 138. The resistor shape to limit flow of the fluid through the resistor bore 142 includes a width of the resistor 144 extending within the central section 300 and transverse sections (e.g., 312), the resistor 144 being configured to divert the fluid received from the upper plenum 138 into the tortuous flow path 162 extending transversely away from the central section 300 and terminating in communication with the lower plenum 146.

Additionally, the configuration of the resistor 144 defines the tortuous flow path 162 including two transverse flow portions, one near extending from the plenum 138, one extending to the lower plenum 146. These flow portions are separated by a flow portion 304 extending parallel to the Z axis direction. Each of the respective upper and lower plenums 138 and 146 of and the resistor 144 is configured with the cross-section 157 related to the same longitudinal axis extending in the Z direction. The upper plenum 138 and the lower plenum 146 and the resistor bore 142 are respectively configured so that the respective cross-sections combine to define the cross-shaped cross-section 157 in which those plenums are upright along that axis and the resistor bore 142 is between those plenums. The resistor bore 142 thus extends transversely relative to that axis and transversely beyond the upright plenums 138 and 146. In one embodiment (FIG. 3B) the shape of the resistor 144 includes a generally flat-sided cross-section including the portions 164 extending transversely relative to the upright plenums 138 and 146. The cross-section of portions 164 are spaced from the resistor bore 142 to define the successive fluid flow paths 160. A first of the fluid flow paths 160 (near plenum 138) defines an initial flow within the resistor bore 142 only transversely beyond the upright plenums. A next of the fluid flow paths 160 extends parallel to the Z axis direction, and a final of the fluid flow paths 160 extends transversely toward the Z axis into intersection with the second plenum 146.

Also in FIG. 3B the cross-section of the embodiment of resistor 144 further includes the barrier surface 164 extending transversely relative to the upright upper plenum 138. The bather surface 164 is shown having a first section 310 aligned with the upper plenum 138 (at central section 300 of bore 142). The barrier surface 164 also has the second section 312 transverse of the upper plenum and spaced from the resistor bore (at section 302 of bore 142) to define the slit 160 for receiving the initial flow of fluid. In one embodiment shown in FIG. 6B, the first bather surface section 310 (at section 300) is recessed (see recess 144D) in a direction of the Z axis to divert fluid received from the upper plenum 138 into the slit 160 to establish the initial flow.

In further review, in another embodiment, the apparatus 100 may further include the first block (or part)_122A extending along the length LH of the proximity head 106, the first block 122A being configured with the first end 124S1 perpendicular to the length LH of the head 106 and with the first fused region 196-1 extending perpendicular to the first end 124S1. The first block 122A may be configured with the main bore 132 and the resistor bore 144 extending through the first end 124S1 and with the portion 200 of the lower plenum 146 extending through the first fusion region 196-1. The first block 122A is further configured with the upper plenum 138 accessible via the portion 200 of the lower plenum 146 and with the plurality of vertical, or down, flow 134 bores accessible via the upper plenum 138. The second block (or part)_122B may extend along the length LH of the proximity head 106, and is configured with the second end 124S2 perpendicular to the length LH of the head 106 and with the second fused region 196-2 extending perpendicular to the second end 124S2. The second block 122B is further configured with the plurality of flat surfaces 126 parallel to the second mating surface 122BM, the second block 122B being configured with the other portion 220 of the lower plenum 146 extending through the second fused region 196-2 and with the plurality of outlet ports (including bores 148, FIG. 3A) extending through one of the flat surfaces 126. The first fused region 196-1 of the first block 122A and the second fused region 196-2 of the second block 122B are joined to hold the first block 122A and the second block 122B fused together to define the one-piece block 122 having the portions 200 & 220 of the second plenum 146 aligned. In another embodiment, each of the first block 122a and second block 122B may be further separately configured from a single piece of PVDF, for example. Also, the resistor bore 142 may be sealed at the first end 124S1, and the main bore 132 is configured with the blind end 132B opposite to the first end 124S1. In another embodiment shown in FIGS. 8A and 8B, the resistor 144P is shaped to fill the resistor bore 142. Also, the resistor 144P is configured from open cell porous material having interstices 250 through which the limited flow of fluid flows from the upper plenum 138 to the lower plenum 146.

In additional review of another embodiment, a proximity head 106 is provided for defining a fluid transfer unit 114, the unit defining a main fluid flow and separate flows of fluid. The separate flows are relative to the plurality of flat surfaces 126 of the head 106 to define the meniscus 108 extending to the surface 104 of the wafer 102 so that the separate flows (e.g., relative to the ports 121 of the unit 114) are substantially uniform across the length LH of the head 106. The plurality of flat surfaces 126 are configured for placement in a substantially parallel orientation with respect to the surface 104 of the wafer 102. The proximity head 106 may include the block 122 extending in the Y direction of the length LH and in the fluid transfer direction Z perpendicular to the length direction and in a width direction X perpendicular to the length and fluid transfer directions. The block 122 defines the plurality of flat surfaces 126. The head 106 includes the main bore 132 configured in the block 122 to initially receive the main fluid flow, the main bore 132 extending along the length of the proximity head. A plurality of the separate flow bores 134 are configured in the block 122 and have first ends 136 connected to the main bore 132. The plurality of separate flow bores 134 are spaced apart from each other along the length of the main bore 132 and have second ends 140. The upper plenum 138 is configured in the block 122 and is connected to the second ends 140 of each of the separate flow bores 134 to transfer the fluid flow relative to the separate flow bores 134. The resistor unit 133, as a resistance or resistor device, is configured with the bore 142 extending in the block 122 along the length of and intersecting the upper plenum 138. The resistor (i.e., unit 133) is further configured with the flow restrictor (or resistor) 144 received in the resistor bore 142 to define at least the one tortuous path 162 for fluid flow relative to the upper plenum 138. The lower plenum 146 is configured in the block 122 with an open top extending in the length direction to transfer fluid relative to the tortuous fluid flow path 162. The lower plenum 146 extends in the fluid transfer direction from the open top to the series of fluid outlets (shown as bores 148 and ports 121) spaced across the length (or Y) direction. The outlet ports 121 are configured in the block 122, one outlet port 121 being connected to each respective fluid outlet 148 for transferring one of the separate flows of the fluid relative to the head 106. With respect to one unit 114 that is defined in the block 122 of the embodiment described in this paragraph, the separate flow relative to each outlet port 121 is substantially uniform with respect to all of the flows from the outlet ports 121 of that one unit 114 across the length of the head 106.

In review of yet another embodiment, the upper plenum 138 and the resistor bore 142 and the lower plenum 146 in combination define the cross-shaped cross-section 157 with the resistor bore 142 extending further in the width direction X than each of the respective upper and lower plenums 138 and 146 extend in the X direction. Also, the flow restrictor 144 is received in the resistor bore 142 extending further in the width (X) direction than each of the respective upper and lower plenums 138 & 146 to define the at least one tortuous path 162 for fluid flow relative to the upper plenum 138 and to the lower plenum 146. The resistor bore of this embodiment may be further configured with the barrier 164 as a fluid diversion wall comprising the first section 312 extending in the width (X) direction to a first terminus 324 (FIG. 3B) offset from the upper plenum 138. The fluid diversion wall further includes the second section (along 304) extending from the first terminus 324 in the fluid transfer direction to a second terminus 326. That wall further includes a third section 328 extending from the second terminus 326 in the width (X) direction to a third terminus 330 adjacent to the lower plenum 146. The flow restrictor 144 received in the resistor bore 142 extends along the sections of the wall (along 302 & 304) and as section 328, for defining the tortuous path 162 so as to extend successively along the first, second, and third sections to restrict the flow of fluid transferred relative to the outlet ports 121 and to the main bore 132. In one embodiment (FIGS. 8A & 8B), the flow restrictor 144 received in the resistor bore 142 is configured with open cell porous material comprising the interstices 250 that form the plurality of tortuous paths 162.

In review of still another embodiment, the configuration of the resistor bore 142 to transfer the fluid relative to the upper plenum 138 may include (FIG. 3B) the central section 300 aligned with the upper plenum 138 and the transverse section 302 offset transversely from the upper plenum 138. The open cell porous material may be received in the central section 300 and in the transverse section 302 so that the plurality of tortuous paths 250 are paths extending in the width (X) direction.

Reviewing another embodiment shown in FIG. 1C, the resistor bore 144 is further configured to extend in the width (X) direction beyond each of the respective first and second plenums 138 & 146 to define transversely opposed grooves 330 offset in the width (X) direction from the plenums 138 & 146. Each groove 330 has a cross section including a base 332 extending in the fluid delivery (Z) direction and opposed transverse walls 334 extending in the width (X) direction and spaced by the base 332. The resistor insert 144 may be configured for reception in one of the grooves 330 against the base 332 of the one groove. The resistor insert 144 may be further configured to extend from the base 332 of the one groove 330 (left groove) into the other (right) groove 330 for reception in the other of the grooves spaced from the walls 334 and from the base 332 of the other (right) groove 330. The resistor insert 144 thus defines a first transverse resistor fluid flow path (upper part of path 162) for fluid transfer only transversely relative to the first plenum 138. The resistor insert 144 thus further defines a fluid flow path (next part of path 162) in series with the first transverse resistor flow path and extending in the fluid delivery (Z) direction. The resistor insert 144 thus further defines a second transverse resistor flow path (lower part of path 162) for fluid transfer only transversely relative to the second plenum 146. The first transverse resistor flow path is thus between the upper plenum 138 and the fluid direction (Z) flow path, and the second transverse resistor flow path is between the lower plenum 146 and the fluid direction flow path.

In review of yet one other embodiment each of the respective first and second plenums 138 and 146 is configured with a plenum width extending in the width (X) direction, the plenum widths being equal. The resistor bore 142 extends in the length (Y) direction parallel to the main bore 132 and to the upper plenum 138 and is configured with a resistor bore width extending in the width (X) direction. The resistor bore width is greater than the plenum width to define shoulders in the form of the sections 334 (FIG. 1C), one shoulder 334 being between the resistor bore 142 and the respective upper plenum 138, another shoulder 334 being between the resistor bore 142 and the lower plenum 146. The resistor bore 142 is further configured with the wall (or base) 332 (FIG. 1C) extending in the fluid transfer (Z) direction between the shoulders 334. The resistor insert 144 may be configured with a separate exterior surface (e.g., barrier surface 164) corresponding to each of the shoulders 334 and to the wall 330 of the resistor bore 142. The exterior surfaces 164 are configured to be received in the resistor bore 142 and define the thin generally-U-shaped continuous fluid transfer pathway (of flow path 162, FIG. 3B) extending within the resistor bore 142 and between the respective upper and lower plenums 138 & 146.

In one embodiment shown in FIGS. 2A & 3A, the block 122 is further configured to define a plurality of the fluid transfer units 114. The plurality of units 114 are spaced across the width (X) direction and are separate from each other as shown in FIGS. 2A & 3A.

In another embodiment, the proximity head 106 provides a plurality of fluid transfer units 114, each unit 114 providing a main fluid flow, and providing separate flows of fluid relative to the surface 104 of the wafer 102. The units cooperate to define the meniscus 108 extending from the proximity head 106 to the wafer surface 104 so that the separate flows are substantially uniform in each respective unit across the length LH of the proximity head 106. The proximity head 106 may include the block 122 defining the proximity head 106 extending in the length (Y) direction across the wafer surface 104 and in the fluid transfer (Z) direction and in the head width (X) direction. The block 122 may be configured with a of the first fluid transfer units 114 including the main bore 132 configured in the block 122 to transfer a main flow of fluid, the main bore 132 extending along the head length LH. The block 122 includes the upper plurality of flow channels 134 extending in the block 122 in the fluid transfer (Z) direction and having first ends 136 in fluid communion with the main bore 132. The upper channels 134 are spaced across the head length HL and have second ends 140 (FIG. 2B). The upper plenum 138 is configured in the block 122 and is connected to the second ends 140 of each of the flow channels 134 to transfer fluid. The main bore 132 and the upper plurality of flow channels 134 are configured to separate the main flow directly into a total number of separate flow paths (e.g., about 100 paths) that are between the main bore 132 and the upper plenum 138. The resistor (in the form of the resistor unit 133) is configured with the resistor bore 142 extending in the block 122 in the length (Y) direction to restrict transfer of fluid in the fluid transfer (Z) direction relative to the upper plenum 138. The resistor bore 142 is configured with the fluid diversion wall (FIG. 1C) including the first section 334 extending transversely in the head width (X) direction; the second section 332 extending from the first section 334 in the fluid transfer (Z) direction; and a third section 334 extending from the second section 332 parallel to the first section 334 to a terminus 340 (FIG. 3B) aligned in the head width (X) direction with the upper plenum 138. The lower plenum 146 is configured with an open top extending along the head length LH in fluid communication with the third section 334 (FIG. 1C) of the resistor 144. The lower plenum 146 is further configured extending in the fluid transfer (Z) direction from the open top to a series of fluid transfer ports (in the form of the fluid transfer bores 148) that are spaced evenly across the length (i.e., of the unit 114). The resistor 133 is further configured with a resistive insert (or resistor) 144 received in the bore 142 for defining the thin flow path 162 along the first, second, and third sections 334 and 332 of the wall of the bore 142 to resist fluid flow relative to the upper plenum 138 and relative to the lower plenum 146. The plurality of fluid transfer ducts 148 are configured in the block 122, one duct 148 being connected to each respective fluid transfer port 121 for providing one of the separate flows of the fluid relative to the surface 104 of the wafer 102. The separate flow of the fluid relative to each fluid transfer duct of a unit is substantially uniform with respect to all of the other separate flows of the fluid provided by all of the other fluid transfer ducts of the unit.

Also as described, the plurality of fluid transfer ducts 148 and the upper plurality of flow channels (or bores 134) define the only separate flows in the block 122 that are solely in the fluid transfer (Z) direction. In one embodiment, and for these separate Z direction flows in the unit 114, the block 122 may thus include only the plurality of bores 134 (the first set of the array) and only the plurality of bores 148 (the second set of the array). Such bores 134 and 148 have been referred to as the plurality of arrays of fluid transfer units, and each such array extends only in the fluid transfer direction of the Z axis, as shown in FIG. 2A, for example. Together, the bores 134 and 148 of one unit 114 are the only bores of the unit 114 that define only separate flows in the block 122 that are solely in the fluid transfer (Z) direction.

In another embodiment, the block 122 is configured with main bore 132 and the upper plurality of flow channels 134 according to the low tolerances, and the block 122 is configured with the plenums 138 & 146 & the resistor units 114 and bores 148 according to the high tolerances. The block 122 is configured as a one-piece block, including the fused region 196.

In another embodiment, the proximity head 106 is characterized in that the main fluid flow (in the bore 132) is at a pressure that is low relative to a pressure of the separate flows relative to the fluid transfer ducts 148 so that the flows of the fluid that are substantially uniform are flows into the fluid transfer ducts 148. The upper plenum 138 and the resistor bore 142 and the lower plenum 146 in combination define the cross-shaped cross-section 157 with the resistor bore 142 extending further in the width (X) direction than the respective upper and lower plenums 138 and 146. The restrictor insert 144 received in the resistor bore 142 is configured to cooperate with the resistor bore 142 to resist fluid flow from the lower plenum 146 and through the resistor bore 142 to the upper plenum 138 so that the separate fluid flow into each fluid transfer duct 148 is substantially uniform with respect to all of the other separate fluid flows into all of the other fluid transfer ducts 148 of the first of the fluid transfer units 114.

In another embodiment, the main fluid flow (in the bore 132) is at a pressure that is low relative to a pressure of the separate flows relative to the fluid transfer ducts 148 so that the flows of the fluid that are substantially uniform are flows into the fluid transfer ducts 148. The block 122 is configured with the first end surface 124S2 extending in the width (X) direction and defining the corner 130 of the block. The upper plenum 138 and the resistor bore 142 and the resistive insert 144 terminate spaced from an end surface, e.g., 124S2, to define a volume in the block 122 adjacent to the end surface 124S2 of the block 122 and to the corner 130. The second fluid transfer unit (in the form of the exemplary unit 114-12 along face 124S2 when the exemplary unit is 114-2, FIG. 7B) is configured in the volume and along the end surface 124S2, the exemplary second unit 114-12 comprising a second lower plenum 146-12, a second plurality of fluid transfer ducts 148-12, and a second series of ports 121-12. The resistive insert 144-12 is configured with the low resistance fluid flow duct 180L (FIGS. 7A & 7C) extending through the resistive insert 144-12 and thus by-passing the thin flow path (or resistive flow space) 160 (FIG. 3B) to provide the low pressure directly to the second lower plenum 146-12 and to the second plurality of fluid transfer ducts 148-12. The second fluid transfer ducts 148-12 are configured (by varying lengths) to distribute the low pressure from the second lower plenum 146-12 to the ports 121-12 of the second unit 114-12 to promote the substantially uniform fluid flow into all of the fluid transfer ducts 148-12 of the second unit 114-12.

In view of the above description and Figures, it may be understood that the above needs are met by the embodiments when the proximity head 106 spans a Y direction distance more than the wafer diameter D, and when the wafer diameter D becomes larger and larger. The prior problems due to (i) increase in the meniscus length LD in the Y direction (so as to process the entire wafer 102 in one relative motion between the proximity head 106 and the wafer 102), and (ii) increase the speed of movement of the wafer relative to the proximity head, may be overcome by the substantial uniformity of flow rates described above. Thus, the identified needs for a system for conditioning fluid flow introduced into a proximity head for delivery to a surface of a wafer are met by the proximity head 106. The proximity head 106 thus has the head surface 124B with the plurality of flat surfaces 126. With the plurality of flat surfaces 126 configured for placement in a substantially parallel orientation with the surface 104 of the wafer 102, in one embodiment fluid flowing for delivery to the wafer surface 104 is substantially conditioned to define the substantially uniform fluid outflow from the plurality of outlet ports 148 to the surface 126. In another embodiment, the proximity head 106 may define the main fluid flow in the main bore 132 and may define the separate flows of fluid delivery to the wafer surface 104 in the ports 148 to define the meniscus 108 extending to the surface 104 of the wafer 102, and the flow rates of the separate flows of one unit 114 are substantially uniform across the head length LH of the head 106. In yet another embodiment, the main fluid flow may be at the pressure that is low relative to the pressure of the separate flows that are into the fluid transfer ducts 148 of the proximity head 106. The flow resistor 144 is configured in the proximity head 106 to render the flow rates of the fluid in one unit 114 substantially uniform into the fluid transfer bores 148 across the head.

For more information on the operation of the proximity head 106, e.g., for the formation of the meniscus 104 and the application of the meniscus to the surface 104 of the substrate 102, reference may be made to: (1) U.S. Pat. No. 6,616,772, issued on Sep. 9, 2003 and entitled "METHODS FOR WAFER PROXIMITY CLEANING AND DRYING,"; (2) U.S. patent application Ser. No. 10/330,843, filed on Dec. 24, 2002 and entitled "MENISCUS, VACUUM, IPA VAPOR, DRYING MANIFOLD," (3) U.S. Pat. No. 6,998,327, issued on Jan. 24, 2005 and entitled "METHODS AND SYSTEMS FOR PROCESSING A SUBSTRATE USING A DYNAMIC LIQUID MENISCUS," (4) U.S. Pat. No. 6,998,326, issued on Jan. 24, 2005 and entitled "PHOBIC BARRIER MENISCUS SEPARATION AND CONTAINMENT," and (5) U.S. Pat. No. 6,488,040, issued on Dec. 3, 2002 and entitled "CAPILLARY PROXIMITY HEADS FOR SINGLE WAFER CLEANING AND DRYING," each is assigned to Lam Research Corporation, the assignee of the present application, and each is incorporated herein by reference.

For additional information regarding the functionality and constituents of Newtonian and non-Newtonian fluids, reference can be made to: (1) U.S. application Ser. No. 11/174,080, filed on Jun. 30, 2005 and entitled "METHOD FOR REMOVING MATERIAL FROM SEMICONDUCTOR WAFER AND APPARATUS FOR PERFORMING THE SAME"; (2) U.S. patent application Ser. No. 11/153,957, filed on Jun. 15, 2005, and entitled "METHOD AND APPARATUS FOR CLEANING A SUBSTRATE USING NON-NEWTONIAN FLUIDS"; and (3) U.S. patent application Ser. No. 11/154,129, filed on Jun. 15, 2005, and entitled "METHOD AND APPARATUS FOR TRANSPORTING A SUBSTRATE USING NON-NEWTONIAN FLUID," each of which is incorporated herein by reference.

The proximity head 106 and operations that manage and interface with the fluid supply and control parameters for the meniscus 108 may be controlled in an automated way using computer control. Thus, aspects of the invention may be practiced with computer system configurations including hand-held devices, microprocessor systems, microprocessor-based or programmable consumer electronics, minicomputers, mainframe computers and the like. The embodiments of the present invention may also be practiced in distributing computing environments where tasks are performed by remote processing devices that are linked through a network.

For the automated control of the proximity head, and the systems that connect the proximity head, the embodiments may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the embodiment of the present invention are useful machine operations. The invention also relates to a device or an apparatus for performing these operations. The apparatus may be specially constructed for the required purposes, or it may include a general purpose computer selectively activated or configured by a computer program stored in the computer. In particular, various general purpose machines may be used with computer programs written in accordance with the teachings herein, or it may be more convenient to construct a more specialized apparatus to perform the required operations.

The present invention can also implement computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

While this invention has been described in terms of several embodiments, it will be appreciated that those skilled in the art upon reading the preceding specifications and studying the drawings will realize various alterations, additions, permutations and equivalents thereof. For example, different numbers of units 114 may be provided and may be interrelated in different ways, and still be within the true spirit and scope of the present invention. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. Apparatus, comprising:
    a first block configured with a length extending across an extent of a wafer surface, the block comprising:
    a main fluid transfer bore configured generally parallel to a head surface across the length;
    a resistor unit extending substantially across the length, the resistor unit defined as an insert disposed in a path between the main bore and the head surface to impose a resistance on a fluid flowing relative to the head surface between the main bore and the head surface; and
    a plurality of fluid transfer units, each fluid transfer unit extending in a fluid transfer direction, the plurality of fluid transfer units consisting of a first set of fluid transfer bores open to and between the main bore and the resistor unit and a second set of fluid transfer bores open to and between the resistor unit and the head surface so that the resistor unit substantially conditions the fluid flowing relative to the head surface and between the main bore and the head surface and across the wafer surface, the conditioning providing for substantially even flow out of the second set of fluid transfer bores across the length.

2. The apparatus as recited in claim 1, wherein:
    the main bore and the resistor unit and the fluid transfer units are configured to cause the fluid flow relative to the head surface to be into the second set of fluid transfer bores and through the resistor unit and into the main bore; and
    the first and seconds sets of bores impose other resistances on the fluid flowing in the respective first and seconds sets of bores, the other resistances being less than the resistance imposed by the resistor unit.

3. The apparatus as recited in claim 1, wherein the number of bores of the first set consists of fewer bores than the number of bores of the second set.

4. The apparatus as recited in claim 1, further comprising a second block extending the length of the first block, the second block including bores that receive the second set of fluid transfer bores of the first block, the second block having a surface to be placed in proximity to the wafer surface, the meniscus definable between the surface of the second block and the wafer surface.

5. A proximity head, comprising:
    a main inlet bore configured to receive a fluid to be provided to the proximity head, the main inlet bore extending along a length of the proximity head;
    a plurality of down flow bores having first ends connected to the main inlet bore, the plurality of down flow bores being spaced apart from each other along the length of the proximity head;
    an upper plenum connected to second ends of the plurality of down flow bores, each down flow bore providing a feed of the fluid into the upper plenum, the upper plenum extending along the length of the proximity head;
    a resistor bore extending along the length of the proximity head and being connected to the upper plenum, the resistor bore being configured to receive a resistor, the resistor having a shape so as to limit flow of the fluid through the resistor bore;
    a lower plenum extending along the length of the proximity head and being connected to the resistor bore, the lower plenum being configured to receive fluid from the resistor bore as limited by the resistor; and
    a plurality of outlet ports defined along the length of the proximity head and extending between the lower plenum and the flat surfaces of the head surface.

6. The proximity head of claim 5, wherein each of the upper and lower plenums and the resistor is configured with a cross-section related to a longitudinal axis.

7. The proximity head of claim 5, wherein the a shape of the resistor includes one of flat surfaces or curved surfaces.

8. The proximity head of claim 5, wherein the apparatus further comprises a first block and a second block, wherein the first and second blocks are joined.

9. The proximity head of claim 8, wherein each of the first and second blocks are further configured from a single piece of PVDF, the resistor bore is sealed at the first end, and the main bore is configured with a blind end opposite to the first end.

10. The proximity head of claim 5, wherein the resistor has a shape that at least partially fills the resistor bore.

11. A proximity head, comprising:
    a body having a length, including,
    a main bore defined in the body and extending along the length;
    a resistor bore defined in the body and extending along the length, the resistor bore defined below the main bore, the resistor bore includes a resistor;
    a first plurality of bores defined between the main bore and the resistor bore;
    a second plurality of bores defined between the resistor bore and an exterior surface of the body, the exterior surface of the body defining a proximity surface of the proximity head.

12. The proximity head of claim 11, wherein the resistor is defined to restrict a fluid flow and substantially condition the fluid flow to providing an evening of fluid flow to the exterior surface of the body.

* * * * *